(12) United States Patent
Murakami

(10) Patent No.: US 7,511,750 B2
(45) Date of Patent: Mar. 31, 2009

(54) PHOTO-ELECTRIC CONVERTING DEVICE AND ITS DRIVING METHOD, AND ITS MANUFACTURING METHOD, SOLID-STATE IMAGE PICKUP DEVICE AND ITS DRIVING METHOD AND ITS MANUFACTURING METHOD

(75) Inventor: Ichiro Murakami, Kanagawa (JP)

(73) Assignee: Sony Corporation (JP)

( * ) Notice: Subject to any disclaimer, the term of this patent is extended or adjusted under 35 U.S.C. 154(b) by 802 days.

(21) Appl. No.: 10/919,448

(22) Filed: Aug. 17, 2004

(65) Prior Publication Data

US 2005/0040440 A1    Feb. 24, 2005

(30) Foreign Application Priority Data

Aug. 20, 2003  (JP)  ............... P2003-296655

(51) Int. Cl.
*H04N 3/14* (2006.01)
*H04N 5/335* (2006.01)

(52) U.S. Cl. .................. 348/294; 348/272; 348/374

(58) Field of Classification Search ............... 348/272, 348/294, 374; 257/225, 432; 250/208.1
See application file for complete search history.

(56) References Cited

U.S. PATENT DOCUMENTS 6,781,210 B2 *  8/2004  Sugimoto et al. ........... 257/435

2005/0263675 A1 * 12/2005 Mouli ................ 250/208.1
2006/0006485 A1 *  1/2006 Mouli ................... 257/432

FOREIGN PATENT DOCUMENTS

| JP | 02-168670 | 6/1990 |
| JP | 03-135069 | 6/1991 |
| JP | 11-017160 | 1/1999 |
| JP | 2003-035846 | 2/2003 |
| JP | 2003-249639 | 9/2003 |

* cited by examiner

*Primary Examiner*—Lin Ye
*Assistant Examiner*—Gevell Selby
(74) *Attorney, Agent, or Firm*—Rader Fishman & Grauer PLLC; Ronald P. Kananen

(57) ABSTRACT

A photo-electric converting apparatus 100 has an arrangement in which a photo-electric converting apparatus 3 is formed on the surface of a substrate 1, an insulating film 11 is formed on the substrate 1, an uneven portion 18 having concavities and convexities in the thickness direction of the substrate 1 is formed on at least a part of the interface between the substrate 1 of the photo-electric converting portion and the insulating film 11 and a recombination region 19 for decreasing a dark current is formed so as to contain the uneven portion 18 within the photo-electric converting portion 3. This photo-electric converting apparatus becomes able to obtain a high sensitivity characteristic and to suppress a dark current from being increased by a decrease of the interface states.

36 Claims, 13 Drawing Sheets

(D1=D2)

PHOTO-ELECTRIC CONVERTING DEVICE AND ITS DRIVING METHOD, AND ITS MANUFACTURING METHOD, SOLID-STATE IMAGE PICKUP DEVICE AND ITS DRIVING METHOD AND ITS MANUFACTURING METHOD

BACKGROUND OF THE INVENTION

1. Field of the Invention

The present invention relates to a photo-electric converting device and its driving method, and its manufacturing method. Also, the present invention relates to a solid-state image pickup device, and its driving method and its manufacturing method.

2. Description of the Related Art

A solid-state image pickup device, for example, an ordinary solid-state image pickup device includes a plurality of photo-electric converting portions like photo-diodes arrayed as light-receiving cells in a one-dimensional fashion (linearly) or in a two-dimensional fashion (in a matrix fashion) on the surface of a semiconductor substrate. When light becomes incident on each of these photo-electric converting portions, signal charges are generated in response to the light and those signal charges are read out by a transfer electrode as a video signal.

FIG. 1 of the accompanying drawings is a cross-sectional view showing a solid-state image pickup device having such an arrangement according to the related art in an enlarged-scale. As shown in FIG. 1, a P-type first semiconductor well layer 52 is formed within an N-type silicon semiconductor substrate 51, and a photo-diode comprising an N-type semiconductor region (so-called electric charge accumulating region) 54 and a P+ semiconductor region (positive electric charge accumulating region) 55 formed on the N-type semiconductor region 54 is formed on the surface of the semiconductor substrate 51.

An N-type transfer channel region 57 comprising a vertical CCD (charge-coupled device) portion 56 is formed on one side of the row of the photo-electric converting portion 53, and a P-type second semiconductor well region 58 is formed under an N-type transfer channel region 57.

A pixel separating region for separating the adjacent pixels adjoining in the horizontal direction, that is, a P+ channel stopper region 59 is formed on the other side of the photo-electric converting portion 53. A transfer gate portion 60 is formed between the photo-electric converting portion 53 and the vertical CCD portion 56 to read signal charges from the photo-electric converting portion 53 to the vertical CCD portion 56.

A silicon oxide film 61 is formed on the surface of the semiconductor substrate 51, and a transfer electrode 62 formed of a poly-crystalline silicon layer is formed on the N-type transfer channel region 57 and the channel stopper region 49. Then, the transfer channel region 57 and the transfer electrode 62 constitute the vertical CCD portion 56. A light-shielding film 63 made of a metal material such as aluminum or tungsten is formed on this transfer electrode 62 through the silicon oxide film 61.

A cover film (passivation film) 64 formed of a transparent silicon oxide film (for example, PSG (phosphor-silicate glasses)) is formed on the whole surface of the light-shielding film 63. Then, a planarized film 65 is formed on this cover film 64 and an on-chip microlens 66 is formed on the planarized film 65 at its position opposing the photo-electric converting portion 53 through a color filter (though not shown).

In the solid-state image pickup device having the above arrangement, a loss of light that is introduced to the photo-electric converting portion 53 from the outside is caused to increase by reflection of light at the interface between the surface of the photo-electric converting portion 53 formed on the semiconductor substrate 51 and the silicon oxide film 61.

More specifically, since transmittance of light at the interface between the surface of the semiconductor substrate 51 and the silicon oxide film 61 is low, the amount of light that can be received by the photo-electric converting portion 53 decreases and hence the photo-electric converting portion 53 cannot obtain sufficient sensitivity.

To solve the above-mentioned problem, there is known a solid-state image pickup device having an arrangement in which an anti-reflection film is formed on the surface of the photo-electric converting portion 53.

More specifically, FIG. 2 is a cross-sectional view showing an example of such solid-state image pickup device having the above arrangement in an enlarged-scale. As shown in FIG. 2, an anti-reflection film 67 is composed of a silicon oxide film 68 formed on the whole surface of the photo-electric converting portion 53 and a silicon nitride film 69, for example, formed on the silicon oxide film 68 and which is made of a material having a refractive index higher than that of the silicon oxide film 68 and which is lower than that of the semiconductor substrate 51.

For example, a refractive index of the silicon oxide film 68 is 1.45 and a refractive index of the silicon nitride film 69 is 2.00. Also, a film thickness of the silicon oxide film 68 and a film thickness of the silicon nitride film 69 are selected to be less than 600 angstroms, preferably, they should be selected in a range of from 250 to 350 angstroms.

In FIG. 2, elements and parts identical to those of FIG. 1 are denoted by identical reference numerals.

Since the anti-reflection film 67 is formed by laminating the silicon oxide film 68 and the silicon nitride film 69 whose refractive indexes and film thicknesses are stipulated as described above, it becomes possible to decrease the reflectance of light on the surface of the photo-electric converting portion 53 up to about 12% to 13%. This means that the reflectance can be decreased up to approximately $\frac{1}{3}$ as compared with the case of the solid-state image pickup device without the anti-reflection film 67 in which the reflectance of light on the surface of the photo-electric converting portion 53 is about 40% as shown in FIG. 1.

Although the anti-reflection film 67 has the silicon oxide film 68 interposed thereon to alleviate stress produced between the semiconductor substrate 51 and the silicon nitride film 69 of the anti-reflection film 67, since this silicon oxide film 68 is made of a material having a middle refractive index between that of single crystal silicon, which is a major material of the semiconductor substrate 51, and that of the silicon nitride film 69, the silicon oxide film 68 is interposed in the anti-reflection film 67, and hence reflection of light unavoidably occurs on the interface of the upper side or the lower side of the silicon oxide film 68.

As a consequence, the amount of light that becomes incident on the photo-electric converting portion 53 decreases finally, and a problem arises, in which the photo-electric converting portion 53 cannot obtain sufficient sensitivity.

In order to solve the above-mentioned problem, it is proposed to further decrease the film thickness of the silicon oxide film 68, for example. However, it does not matter how the film thickness of the silicon oxide film 68 should be decreased, so long as the silicon oxide film 68 is interposed in the anti-reflection film 67, it is unavoidable that reflection of light occurs on the interface of the upper side or the lower side of the silicon oxide film 68.

That is, since the refractive index changes intermittently in a series of light path of incident light such as the silicon nitride film 69, the silicon oxide film 68 and the surface of the semiconductor substrate 51, it is unavoidable that reflection occurs in the incident light at the interfaces of the respective layers.

In order to solve the above-mentioned problem, there is known an arrangement in which a photonic crystal is provided on a semiconductor substrate, for example (see cited patent reference 1).

More specifically, in this photonic crystal, when a distance (pitch) between the adjacent photonic crystals is selected to be approximately ½ of a wavelength of light that is set as an image pickup target, the refractive index gently changes from the upper portion of the interface of the silicon semiconductor substrate to the inside of the interface of the silicon semiconductor substrate. As a result, a loss of light can be suppressed as compared with the case in which light becomes incident on the interface of the flat semiconductor substrate, for example, and an amount of light that becomes incident on the photo-electric converting portion 53 can increase, thereby resulting in high sensitivity being obtained.

[Cited Patent Reference]

Official Gazette of Japanese laid-open patent application No. 2003-35846

However, when the photonic crystal is provided on the semiconductor substrate as described above, the following problem arises, for example.

More specifically, when the photonic crystal is formed, stress occurs in the single crystal silicon comprising the semiconductor substrate, a crystal defect occurs on the surface (interface) of the semiconductor substrate 1, and hence a dark current is increased by the interface states caused by the crystal defect.

Accordingly, although it becomes possible to obtain sufficient sensitivity by the photonic crystal provided on the semiconductor substrate, the increase of the dark current from the interface states cannot be suppressed and hence it is difficult to improve an S/N (signal-to-noise ratio), for example.

More specifically, when the photonic crystal is provided on the semiconductor substrate, it was difficult to achieve both the high sensitivity characteristic and the decrease of the dark current at the same time.

The above-mentioned problems occur not only in the solid-state image pickup device having the above arrangement but also in a photo-electric converting device of which photo-electric converting portion is formed of a photo-coupler used singly and the like.

SUMMARY OF THE INVENTION

In view of the aforesaid aspect, it is an object of the present invention to provide a photo-electric converting device, its driving method and its manufacturing method in which a high sensitivity characteristic and suppression of an increase of a dark current caused by interface states can be achieved at the same time.

It is another object of the present invention to provide a solid-state image pickup device, its driving method and its manufacturing method in which a high sensitivity characteristic and suppression of an increase of a dark current caused by interface states can be achieved at the same time.

According to an aspect of the present invention, there is provided a photo-electric converting device having a substrate, a photo-electric converting portion formed on the surface of the substrate and an insulating film formed on the substrate. This photo-electric converting device is comprised of an uneven portion formed at least on one portion of an interface between the substrate of the photo-electric converting portion and the insulating film, the uneven portion having an uneven shape formed along a thickness direction of the substrate and a recombination region for decreasing a dark current formed within the photo-electric converting portion so as to contain at least one portion of the uneven portion.

According to other aspect of the present invention, there is provided a method of driving a photo-electric converting device having a substrate, a photo-electric converting portion formed on the surface of the substrate and an insulating film formed on the substrate, comprising an uneven portion formed at least on one portion of an interface between the substrate of the photo-electric converting portion and the insulating film, the uneven portion having an uneven shape formed along a thickness direction of the substrate and a recombination region for decreasing a dark current formed within the photo-electric converting portion so as to contain at least one portion of the uneven portion. This method is comprised of the step of forming a recombination region within the uneven portion by applying a reverse bias voltage to the electrode.

According to a further aspect of the present invention, there is provided a method of manufacturing a photo-electric converting device in which a photo-electric converting portion is formed on the surface of a substrate, with an insulating film being formed on the substrate. This method is comprised of the steps of forming a first conductivity type region on the surface of the substrate, forming an uneven portion having an uneven shape formed along the thickness direction of the substrate on an interface between the first conductivity type region and the insulating film and forming a recombination region formed of a second conductivity type region within the uneven portion after the step of forming the uneven portion on the interface.

According to yet a further aspect of the present invention, there is provided a solid-state image pickup device having a substrate, a plurality of photo-electric converting portions formed on the surface of the substrate and an insulating film formed on the substrate. This solid-state image pickup device is comprised of an uneven portion formed at least on one portion of an interface between the substrate of the photo-electric converting portion and the insulating film, the uneven portion having an uneven shape formed along a thickness direction of the substrate and a recombination region for decreasing a dark current formed within the photo-electric converting portion so as to contain at least one portion of the uneven portion.

In accordance with still a further aspect of the present invention, there is provided a method of driving a solid-state image pickup device having a substrate, a plurality of photo-electric converting portions formed on the surface of the substrate and an insulating film formed on the substrate in which an uneven portion is formed at least on one portion of an interface between the substrate of the photo-electric converting portion and the insulating film, the uneven portion having an uneven shape formed along a thickness direction of the substrate. This method is comprised of the step of forming a recombination region within the uneven portion by applying a reverse voltage to the electrode.

In accordance with still a further aspect of the present invention, there is a method of manufacturing a solid-state image pickup device in which a plurality of photo-electric converting portions are formed on the surface of a substrate, with an insulating film being formed on the substrate. This method is comprised of the steps of forming a first conductivity type region on the surface of the substrate, forming an uneven portion on an interface between the first conductivity type region and the insulating film, and the uneven portion having an uneven portion formed along the thickness direction of the substrate and forming a recombination region formed of a second conductivity type region within the uneven portion.

DESCRIPTION OF THE PREFERRED EMBODIMENTS

The present invention will be described below with reference to the drawings.

First, a solid-state image pickup device according to an embodiment of the present invention will be described with reference to FIG. 3 which is an enlarged cross-sectional view.

Figure 1:
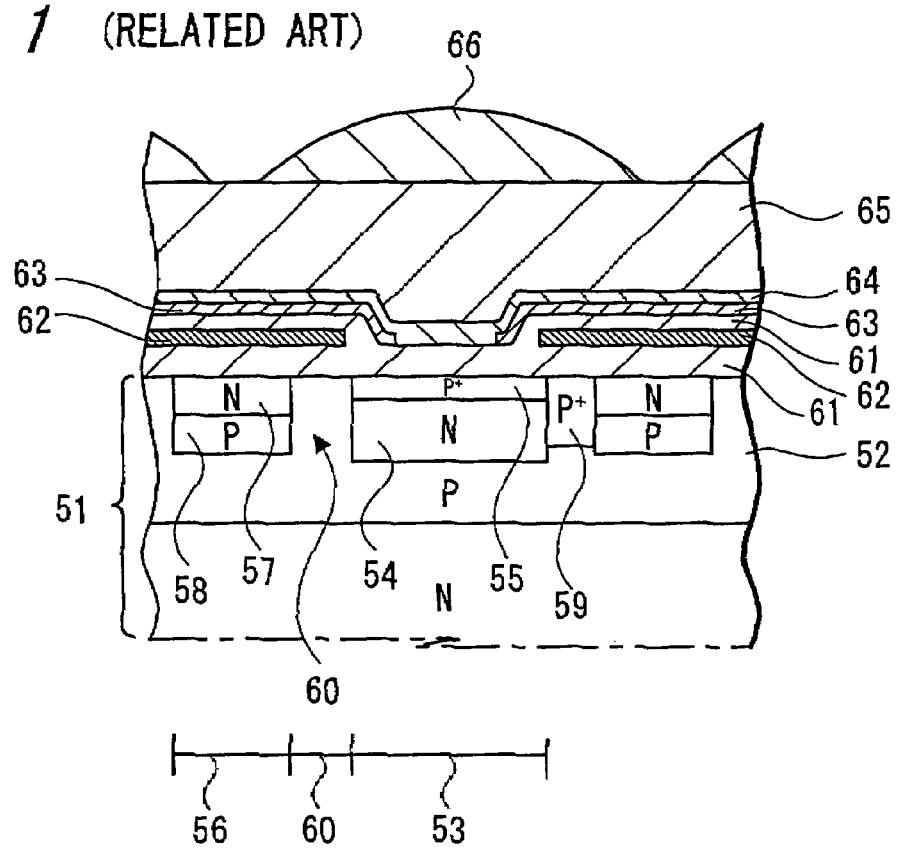
FIG. 1 is a schematic cross-sectional view showing an example of a solid-state image pickup device according to the related art.
Figure 2:
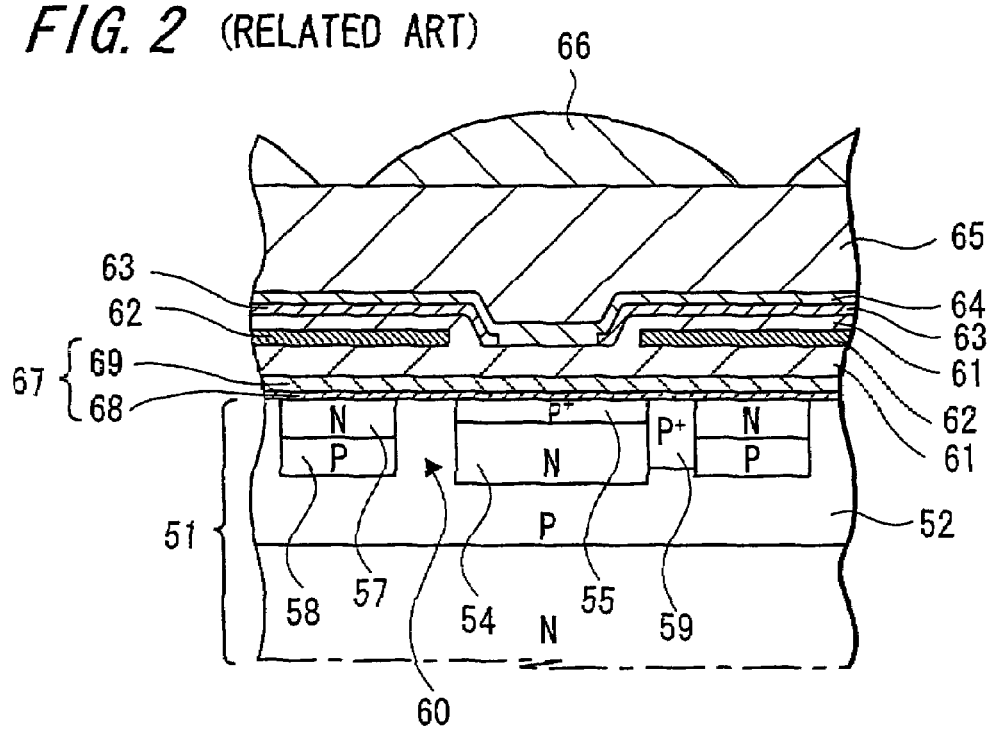
FIG. 2 is a schematic cross-sectional view showing another example of a solid-state image pickup device according to the related art.
Figure 3:
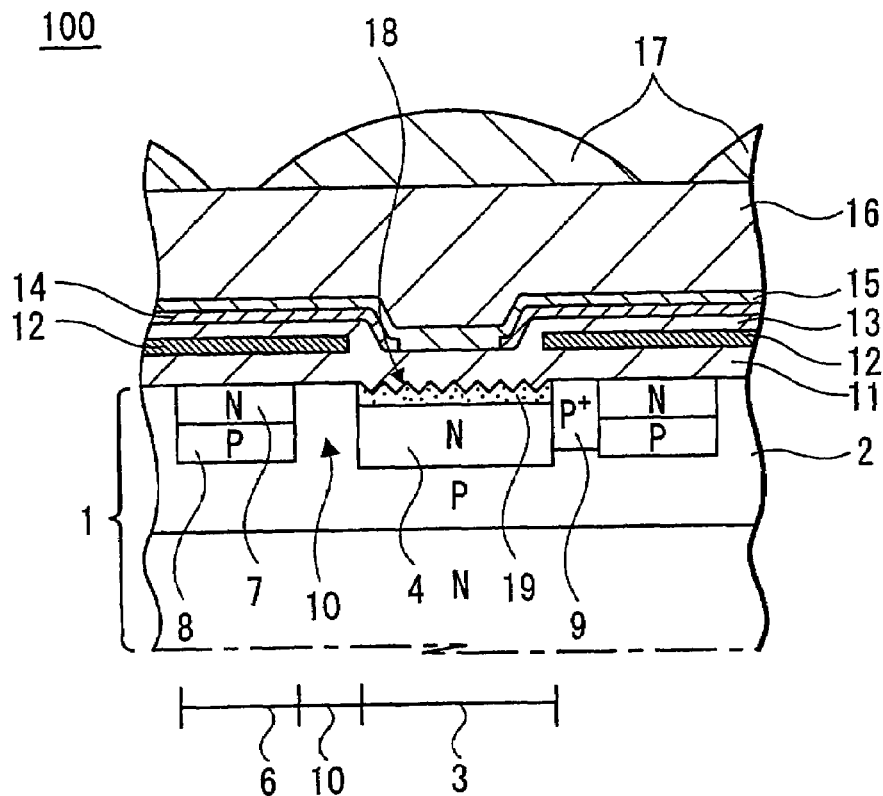
FIG. 3 is a schematic cross-sectional view showing a solid-state image pickup device according to an embodiment of the present invention.

As shown in FIG. 3, a solid-state image pickup device 100 according to this embodiment includes an N-type silicon semiconductor substrate 1 which is mainly made of high-purity single crystal silicon (Si) in which a P-type first semiconductor well layer 2 is formed. A photo-diode formed of an N-type semiconductor region (so-called electric charge accumulating region) 4, for example, comprising a photo-electric converting portion 3 is formed on the surface side of the semiconductor substrate 1.

An N-type transfer channel region 7 comprising a vertical CCD portion 6 is formed on one side of the row of the photo-electric converting portion 3, and a P-type second semiconductor well region 8 is formed under the N-type transfer channel region 7.

A pixel separating region for separating the adjacent pixels adjoining in the horizontal direction, that is, a heavily-doped P-type channel stopper region 9 is formed on the other side of the photo-electric converting portion 3. A transfer gate portion 10 is formed between the photo-electric converting portion 3 and the vertical CCD portion 6 to read out signal charges from the photo-electric converting portion 3 to the vertical CCD portion 6.

An insulating film 11 made of a material different from the material (for example, a material which results from injecting predetermined impurities into the single crystal silicon of the semiconductor substrate 1) of the photo-electric converting portion 3, for example, a silicon oxide film or a silicon nitride film, is formed on the surface of the semiconductor substrate 1. In this insulating film 11, a transfer electrode 12 formed of a poly-crystalline silicon layer, for example, is formed on the transfer gate portion 10, the N-type transfer channel region 7 and the channel stopper region 9. Then, the transfer channel region 7 and the transfer electrode 12 constitute the vertical CCD portion 6. A light-shielding film 14 made of a metal material such as aluminum or tungsten is formed on this transfer electrode 12 through an interlayer insulator 13.

Also, a cover film (passivation film) 15 formed of a transparent silicon oxide film (for example, PSG (phosphor silicate glasses)) is formed on the whole surface of the light-shielding film 14. Then, a planarized film 16 is formed on this cover film 15, and an on-chip microlens 17 is formed on the cover film at a position corresponding to the photo-electric converting portion 13 through a color filter (not shown).

An uneven portion (photonic crystal) 18 in which the ratio of the single crystal silicon comprising the semiconductor substrate 1 relative to the silicon oxide film comprising the insulating film 11 increases progressively (continuously) is formed at the interface between the insulating film 11 and the photo-electric converting portion 3. That is, the uneven portion 18 is formed on the surface of the N-type semiconductor region 4.

Figure 4:
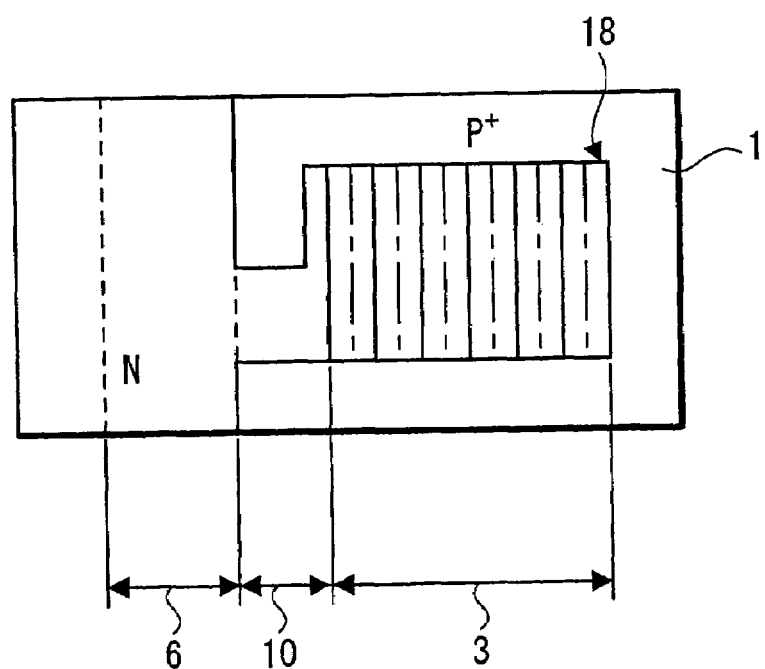
FIG. 4 is a plan view showing an uneven portion of the solid-state image pickup device shown in FIG. 3.
Figure 5:
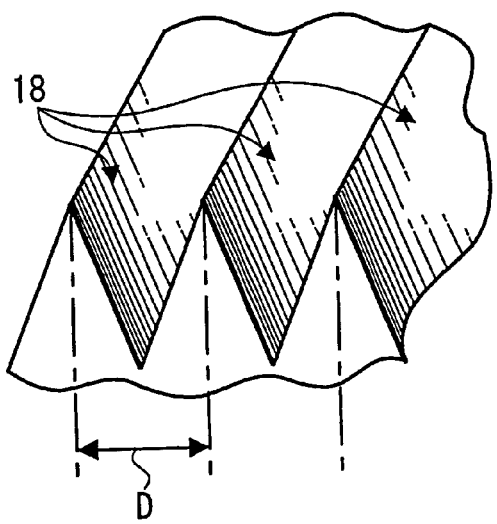
FIG. 5 is a perspective view showing the uneven portion of the solid-state image pickup device shown in FIG. 3 in an enlarged-scale.

FIG. 4 is a plan view of the uneven portion 18, and FIG. 5 is a perspective view showing the uneven portion 18 in an enlarged-scale. As shown in FIGS. 4 and 5, the uneven portion 18 is formed on the surface of the N-type semiconductor substrate 4 such that its longitudinal direction is laid in parallel to the flat major plane of the semiconductor substrate 1, and is shaped like a triangular prism, for example.

As shown in FIG. 5, a dimension D (dimension D of a pitch between the adjacent triangular prisms) of a pitch of a plurality of triangular prisms comprising the triangular prism-like uneven portion 18 can be selected to be less than the longest wavelength of light that is set as an image pickup target of the solid-state image pickup device and further it should preferably be set to be less than the shortest wavelength of light. Also, more desirably, the above dimension D can be set to a range of from ½ to ⅕ of the thus set shortest wavelength of light.

When the dimension D of the pitch is set as described above, a refractive index within a medium relative to incident light within the uneven portion 18 is fluctuated continuously (that is, the refractive index within the uneven portion 18 dependent upon the wavelength of incident light is fluctuated continuously).

For example, when the light set as the image pickup target is visible light, it is customary that a visible light region falls within a range of from approximately 400 nm to 700 nm. Thus, the dimension D of the pitch between the adjacent triangular prisms is set to be 300 nm which is shorter than the shortest wavelength, for example.

The triangular prism-like uneven portions 18 are formed such that their longitudinal directions (ridgelines) are arrayed substantially in parallel to the vertical CCD portion 6 or the longitudinal direction (signal charge transfer direction) of the transfer electrode 12. As a consequence, of two polarized light components of a P-polarized light component and a S-polarized light component that are perpendicular to each other in the incident light, the amount in which a polarized light component (P-polarized light component) having a large degree to cause invalid electric charges serving as a noise component such as smear, crosstalk and mixed color is introduced into the photo-electric converting portion 3 can be decreased. Also, reflection of a polarized light component (S-polarized light component) of light having a small degree to cause smear can be decreased reliably, and transmittance of light having a low degree to cause smear relatively can be improved.

Since the transmittance of light having a large degree to cause the smear is not improved while the transmittance of light having a small degree to cause the smear is improved, the amount of light which causes the smear relatively can be decreased relative to the increase of the light amount of the whole of the incident light. As a result, the relative ratio of light that causes the noise in the whole to the amount of light received by the photo-electric converting portion 3 can be decreased and substantial improvement of S/N can be achieved.

In FIG. 4, in the photo-electric converting portion 3, a solid-line represents the base of the triangular prism comprising the uneven portion 18 and a dot-and-dash line represents the top side (ridgeline) of the triangular prism.

When the triangular prism-like uneven portion 18 having the above arrangement is formed on the surface (interface) of the semiconductor substrate 1, a substantial refractive index at the interface between the photo-electric converting portion 3 made of fundamentally single crystal silicon (Si) and the insulating film 11 formed of the silicon oxide film ($SiO_2$) progressively changes from the ridgelines of the triangular prisms to the bottom portion side of the semiconductor substrate 1.

Figure 6A:
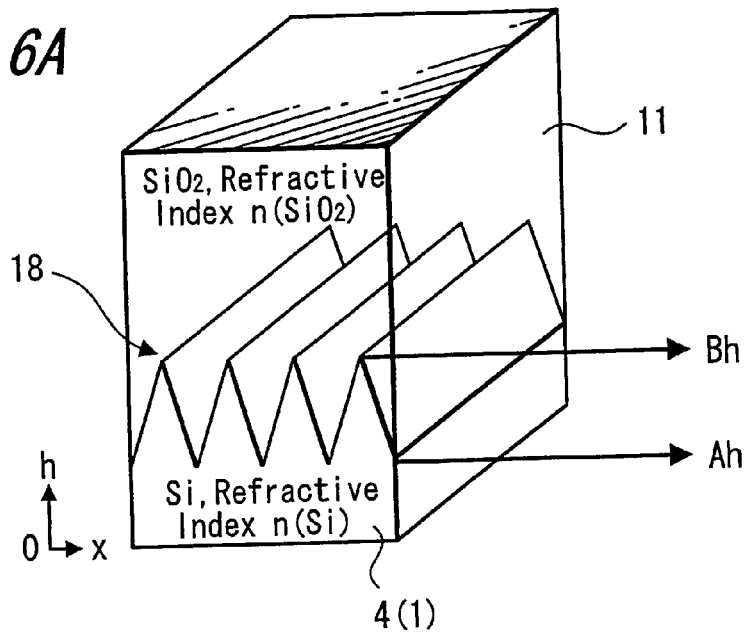
FIG. 6A is a schematic diagram showing the portion near the uneven portion of the solid-state image pickup device shown in FIG. 3.
Figure 6B:
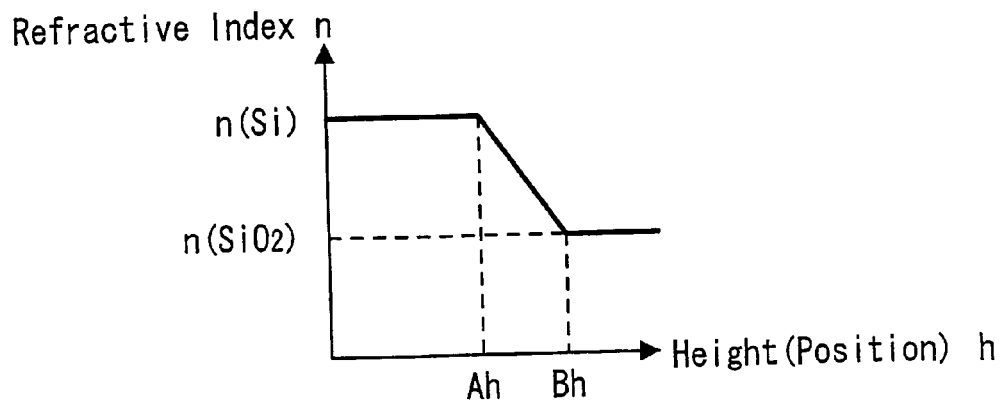
FIG. 6B is a diagram showing a relationship between heights and refractive indexes of an insulating film and a semiconductor substrate.

More specifically, as shown in FIGS. 6A and 6B, having compared a refractive index n (Si) of the single crystal silicon (Si) and a refractive index n ($SiO_2$) of the silicon oxide film, it is to be understood that n ($SiO_2$)<n (Si). Thus, the substantial refractive index continuously increases monotonically from the ridgelines of the triangular prisms to the bottom portion side of the semiconductor substrate 1 (toward the deep portion of the photo-electric converting portion 3 from the outside in the light path of the incident light).

Thus, having compared the present invention with the conventional solid-state image pickup device in which the interface between the surface of the photo-electric converting portion and the insulating film is formed flat and in which the refractive index is changed at that interface continuously (discretely), it is to be understood that reflection of incident light at the interface between the surface of the photo-electric converting portion and the insulating film can be decreased considerably. Accordingly, the final amount of light incident on the photo-electric converting portion 3 can be increased and hence it becomes possible to improve the sensitivity of the photo-electric converting portion 3.

Figure 7:
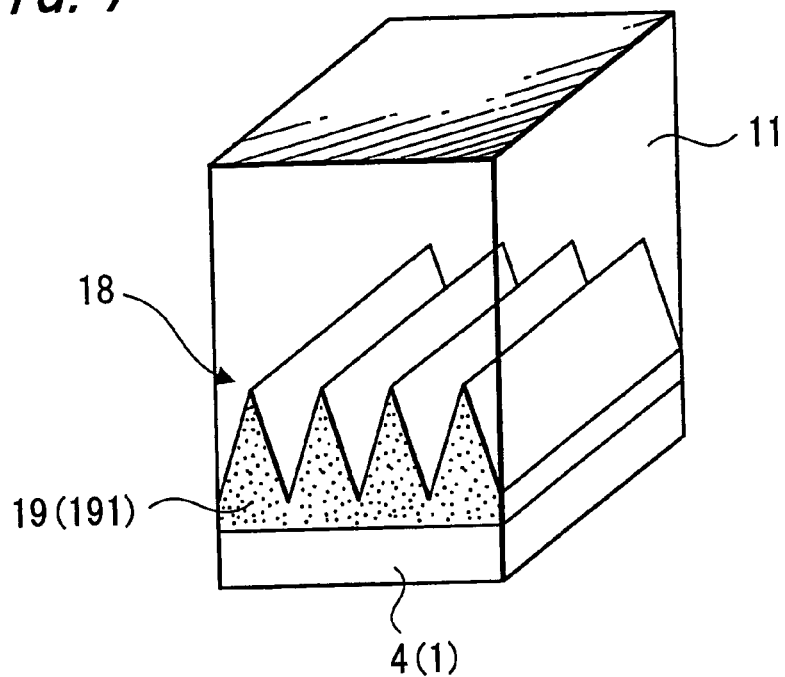
FIG. 7 is a schematic diagram showing an example of the uneven portion.

Then, according to this embodiment, as FIG. 7 shows a schematic diagram of the uneven portion 18, in particular, a recombination region 19 for decreasing a dark current is formed within the uneven portion 18.

The recombination region 19 is a region for re-combining electrons, which serve as the dark current, produced by a crystal defect and the like of the silicon-silicon oxide film interface region on the surface of the silicon semiconductor substrate 1, for example, with positive holes. In the solid-state image pickup device according to this embodiment, since the triangular prism-like uneven portion 18 is formed on the surface (interface) of the first conductivity type region, for example, the N-type semiconductor region (electric charge accumulating region) 4, in order to form the recombination region 19 on this uneven portion 18, a second conductivity type region, for example, a P-type semiconductor region 191 is formed within the uneven portion 18.

In consequence, a depletion region is formed between the N-type semiconductor region and the P-type semiconductor region and the space between the surface of the uneven portion 18 and the depletion region becomes the recombination region 19.

When the P-type impurity concentration of this recombination region 19 is adjusted to become a high concentration, the recombination region 19 can serve as a positive electric charge accumulating region formed on the surface of the photo-electric converting portion 3 as well.

The recombination region 19 is formed from the surface to the region of the depth direction within the uneven portion 18 formed on the surface (interface) of the photo-electric converting portion 3. While the recombination region 19 is formed on the whole of the uneven portion 18 in the case of FIG. 7, the present invention is not limited thereto and the recombination region 19 can be formed on a part of the inside of the uneven portion 18. However, if the recombination region 19 is formed on the whole of the uneven portion 18, then electrons serving as the dark current and positive holes can be recombined more.

According to the solid-state image pickup device of this embodiment, since the recombination region 19 is formed within the uneven portion 18 formed on the surface (interface) of the semiconductor substrate 1, in particular, the surface of the photo-electric converting portion 3, when the uneven portion (photonic crystal) 18 is formed on the interface of the semiconductor substrate 1, even if stress occurs in the semiconductor substrate 1 made of the single crystal silicon to cause a crystal defect or the like, the electrons serving as the dark current and the positive holes can be recombined within the recombination region 19 within the uneven portion 18.

As a result, the electrons serving as the dark current can be extinguished and the increase of the dark current due to the interface states can be suppressed.

Also, since the uneven portion 18 has the arrangement in which the substantial refractive index continuously increases monotonically as the incident light travels from the outside to the deep portion of the photo-electric converting portion 3, as compared with the case of the solid-state image pickup device having the arrangement in which the interface between the surface of the photo-electric converting portion and the insulating film is formed flat so that the refractive index changes intermittently at the interface, reflection of incident light at the interface between the surface of the photo-electric converting portion 3 and the insulating film can be decreased considerably, the final amount of light incident on the photo-electric converting portion 3 can be increased and hence the sensitivity of the photo-electric converting portion 3 can be improved.

Also, since the uneven portion 18 cannot improve the transmittance of light having the large degree to cause the smear while the longitudinal directions (ridgelines) of the uneven portion 18 are arranged substantially in parallel to the vertical CCD portion 6 or the longitudinal direction (signal charge transfer direction) of the transfer electrode 12, which will be described later on, so that it can improve the transmittance of light having a small degree to cause the smear, the amount of light which causes the smear can be decreased relative to the increase of the whole light amount of the incident light and the substantial improvement of the S/N can be achieved.

While the recombination region 19 for decreasing the dark current is formed from the surface to the deep region of the uneven portion 18 as shown in FIG. 7 in the case of the above-mentioned solid-state image pickup device according to the embodiment, when the recombination region 19, for example, is formed up to the deep region of the uneven portion 18, although the electrons serving as the dark current can be recombined with the positive holes, there is a risk that signal electric charges photo-electrically converted within the recombination region 19 will be extinguished.

For example, when the light set as the image pickup target is visible light, if such visible light is light with a short wavelength of approximately 400 nm, then the photo-electrically converted signal electric charges are extinguished considerably, and a decrease of sensitivity becomes remarkable.

A solid-state image pickup device according to another embodiment of the present invention in which the above-mentioned problems can be solved will be described with reference to FIG. 8.

According to the solid-state image pickup device of this embodiment, although the recombination region for decreasing the dark current is formed within the uneven portion 18 similarly to the case of the above-mentioned solid-state image pickup device according to the embodiment (FIG. 7), this recombination region 19 is formed in correspondence with the concavities and convexities (ups and downs of concavities and convexities) of the uneven portion 18.

The recombination region 19 can be formed with a depth of less than 0.5 μm from the surface of the uneven portion 18 to the depth direction. That is, a film thickness 19D of the recombination region 19 can be selected within a range of 0.5 μm.

The rest of the arrangement of this solid-state image pickup device is similar to that of the solid-state image pickup device of the above-mentioned embodiment. Hence, identical elements and parts are denoted by identical reference numerals and therefore need not be described.

According to the solid-state image pickup device of this embodiment, since the recombination region 19 is formed in correspondence with the concavities and convexities of the uneven portion 18, as compared with the solid-state image pickup device of the above-mentioned embodiment (see FIG. 7) in which the recombination region 19 is formed up to the deep region of the uneven portion 18, the recombination region 19 is formed on only the surface (interface) of the uneven portion 18.

As a result, since the electrons serving as the dark current can be recombined with the positive holes on the surface side of the uneven portion 18 and recombination of the photo-electrically converted signal electric charges can be suppressed on the deep region side of the uneven portion 18, a decrease of signal electric charges can be suppressed.

Accordingly, in addition to the case of the solid-state image pickup device of the above-mentioned embodiment, a decrease of sensitivity can be suppressed.

Next, a solid-state image pickup device according to a further embodiment of the present invention will be described.

Figure 8:
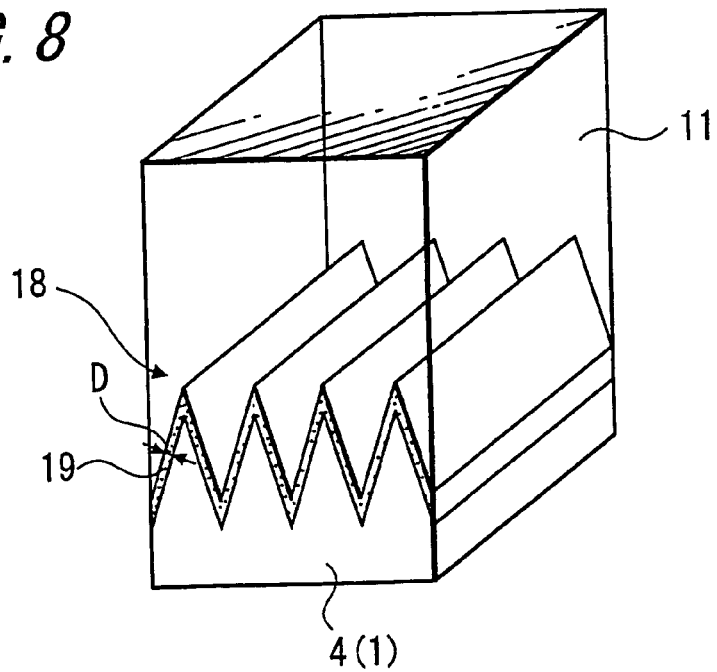
FIG. 8 is a schematic diagram showing another example of the uneven portion shown in FIG. 7.
Figure 9:
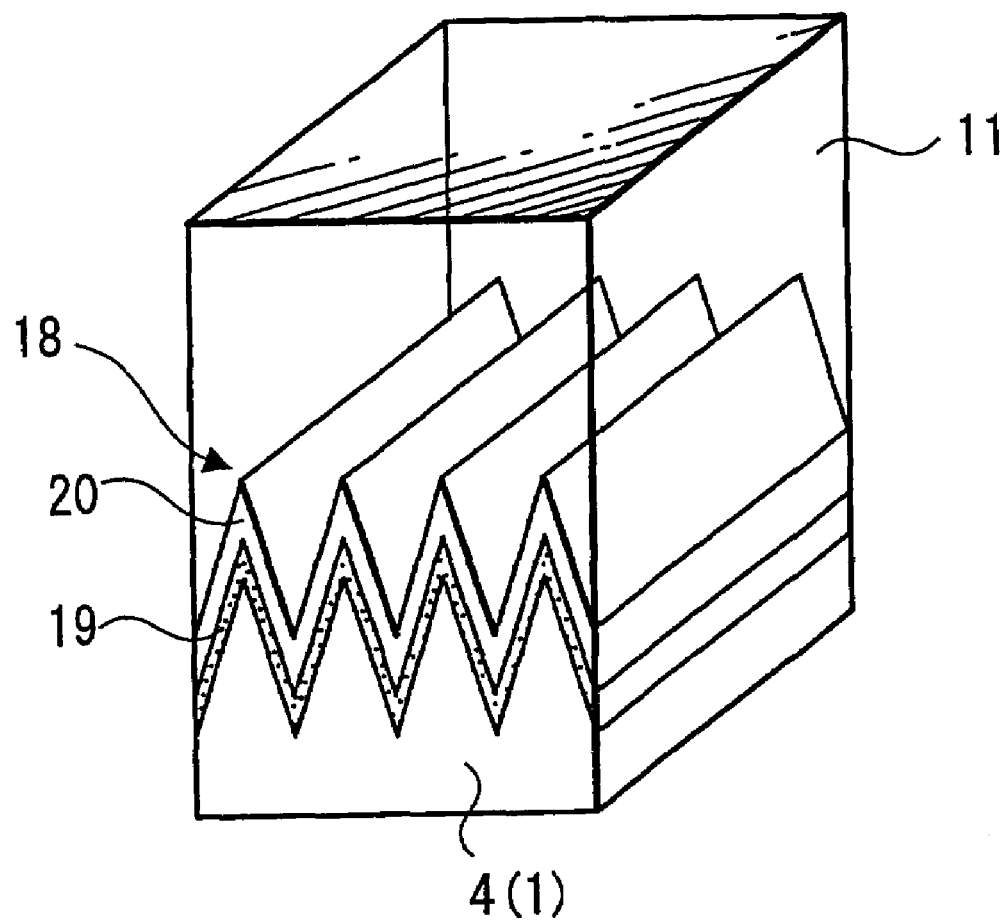
FIG. 9 is a schematic diagram showing a further example of the uneven portion shown in FIG. 7.

While the solid-state image pickup device according to this embodiment has the recombination region 19 formed within the uneven portion 18 to decrease the dark current similarly to the cases of the solid-state image pickup devices of the above-mentioned embodiments (see FIGS. 7 and 8), as shown in FIG. 9, an oxide film 20 is formed on the upper portion of the uneven portion 18. This oxide film 20 may be formed on the whole of or a part of the upper portion of the uneven portion 18.

The rest of the arrangement of the solid-state image pickup device according to this embodiment is similar to that of the solid-state image pickup device according to the embodiment shown in FIG. 8. Hence, identical elements and parts are denoted by identical reference numerals and therefore need not be described.

According to the solid-state image pickup device of this embodiment, since the oxide film 20 is formed on the upper portion of the uneven portion 18, as compared with the cases of the solid-state image pickup devices of the above-mentioned embodiments in which the oxide film 20 is not formed on the upper portion of the uneven portion 18, for example (see FIGS. 7 and 8), it is possible to further improve the sensitivity characteristic.

More specifically, when the oxide film 20 is formed on the upper portion of the uneven portion 18 shaped like the triangular prism, light introduced from the outside is passed through the oxide film 20 and introduced toward the deep portion of the photo-electric converting portion 3 through the uneven portion 18. In this case, as compared with the solid-state image pickup device having the arrangement in which the oxide film 20 is not formed on the upper portion of the uneven portion 18 so that light introduced from the outside is simply introduced through the uneven portion 18 into the deep portion of the photo-electric converting portion 3, since the light is passed through the oxide film 20, a refractive index at which incident light introduced into the inside of the silicon from the vacuum or atmosphere is refracted in the medium can be fluctuated gently.

As a result, the loss of light that becomes incident on the photo-electric converting portion 3 can be decreased and it becomes possible to increase the amount of light introduced into the photo-electric converting portion 3.

Also, in the oxide film 20, when ions of N-type impurities are implanted into the uneven portion 18 in the process in which the recombination region 19 corresponding to the concavities and convexities of the uneven portion 18 is formed on the surface of the uneven portion 18, the oxide film 20 formed on the uneven portion 18 to protect the semiconductor substrate 1 need not be removed but can be used as it is. In this case, in the manufacturing process, for example, the process for removing the oxide film can be removed and the manufacturing process can be simplified.

Next, a solid-state image pickup device according to yet a further embodiment of the present invention will be described.

While the solid-state image pickup device according to this embodiment has the recombination region 19 formed within the uneven portion 18 to decrease the dark current similarly to the case of the solid-state image pickup device according to the above-mentioned embodiment (see FIG. 7), this embodiment differs from the above-mentioned embodiment in the manner of forming the recombination region 19.

Figure 10A:
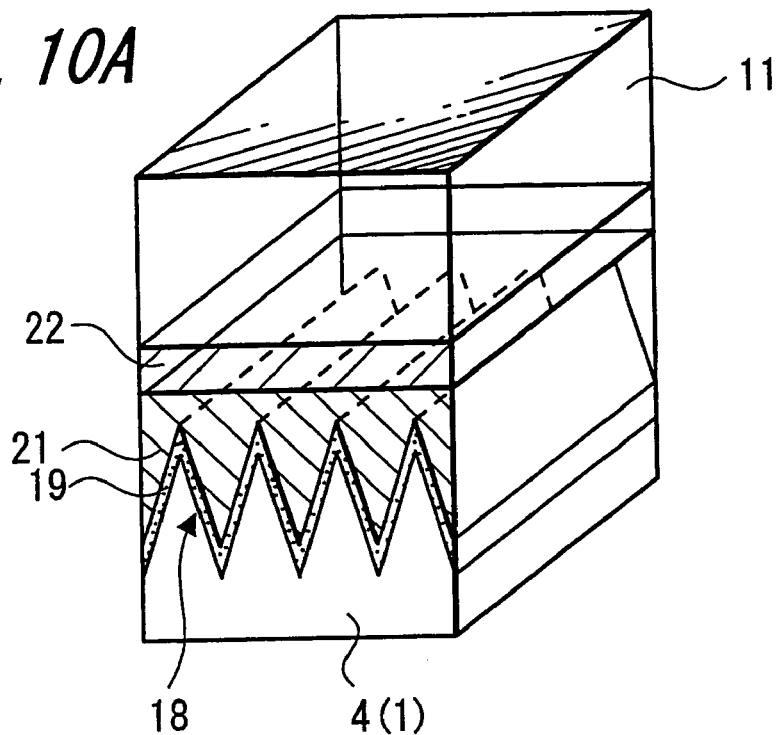
FIGS. 10A and 10B are schematic diagrams showing yet further examples of the uneven portion shown in FIG. 7, respectively.

More specifically, in the solid-state image pickup device according to this embodiment, as shown in FIG. 10A, an electrode 22 is formed on the uneven portion 18 through an insulating film 21. This electrode 22 may be formed on a part of or the whole of the upper portion of the uneven portion 18.

As the electrode 22, there can be used a transparent electrode or a thin electrode made of polysilicon.

The rest of the arrangement of this solid-state image pickup device is similar to that of the solid-state image pickup device according to the above-mentioned embodiment shown in FIG. 8. Hence, identical elements and parts are denoted by identical reference numerals and therefore need not be described.

Next, a method of driving the solid-state image pickup device having the above arrangement will be described.

First, in the solid-state image pickup device having the above-mentioned arrangement in which the electrode 22 is formed on the upper portion of the uneven portion 18 through the insulating film 11, a reverse bias voltage is applied to the electrode 22 by an external voltage applying means (not shown) so that the recombination region 19 may be formed within the uneven portion 18. In this embodiment, since the uneven portion 18 is formed on the surface of the N-type semiconductor region (electric charge accumulating region) 4 as described above, a positive voltage is applied to the electrode 22 as the reverse bias voltage for forming the recombination region 19 within the uneven portion 18. As a result, an inverting layer, that is, a recombination region 19 is formed within the uneven portion 18.

The timing at which the reverse bias voltage is applied to the electrode 22 is a time at which signal electric charges are accumulated in at least the photo-electric converting portion 3. For example, in the case of a FT (frame transfer) type solid-state image pickup device, when signal electric charges are accumulated, the reverse bias voltage is applied. When signal electric charges are transferred in the frame transfer type solid-state image pickup device, application of the reverse bias voltage is stopped temporarily.

Depending upon the arrangement of the solid-state image pickup device, the reverse bias voltage, for example, may be applied when signal electric charges are accumulated and when signal electric charges are transferred.

According to the solid-state image pickup device of this embodiment, since the electrode 22 is formed on the uneven portion 18 through the insulating film 21, as will be described later on, when the reverse bias voltage (positive voltage) is applied so that the recombination region 19 may be formed on the surface of the uneven portion 18 through this electrode 22, for example, the recombination region 19 can be formed within the uneven portion 18.

As a result, even if stress occurs in the semiconductor substrate 1 made of the single crystal silicon to produce a crystal defect when the uneven portion (photonic crystal) 18 is formed on the interface of the semiconductor substrate 1 similarly to the cases of the above-mentioned solid-state image pickup devices (see FIGS. 7, 8 and 9), the electrons serving as the dark current can be recombined with the positive holes by the recombination region 19 formed within the uneven portion 18 and thereby the occurrence of the dark current due to the interface states can be suppressed.

Also, according to the solid-state image pickup device driving method according to this embodiment, since the reverse bias voltage is applied to the electrode 22 formed on the uneven portion 18 through the insulating film 21 so that the recombination region 19 may be formed within the uneven portion 18, when the solid-state image pickup device having the arrangement in which the electrode 22 is formed on the upper portion of the uneven portion 18 through the insulating film 11 is driven as described above, the recombination 19 for decreasing the dark current can be formed within the uneven portion 18.

Also, the driving method according to this embodiment is suitable for use with the FT type solid-state image pickup device in which the vertical CCD portion, for example, serves the function of photo-electric conversion, electric charge accumulation and electric charge transfer as well and an FF (full-frame) type solid-state image pickup device, for example.

Figure 10B:
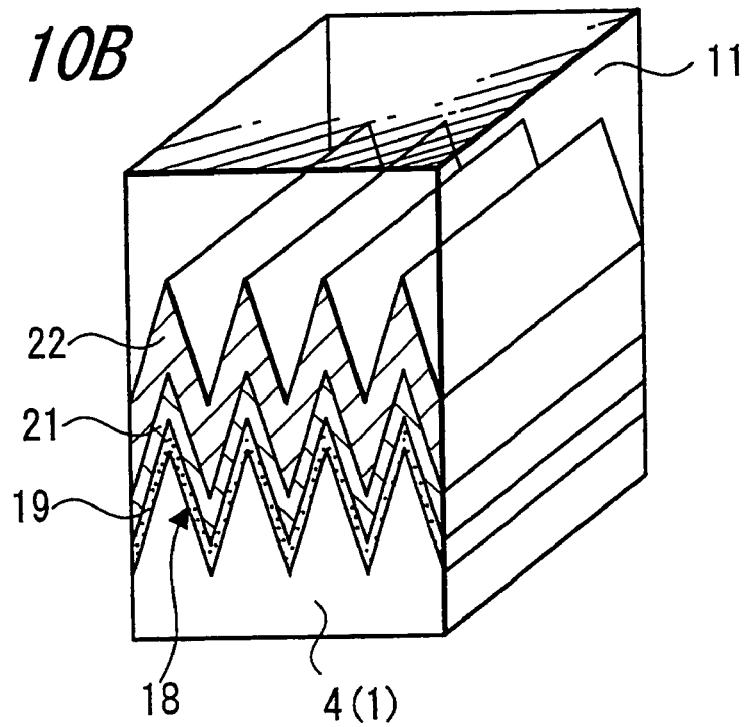

While FIG. 10A shows the case in which the electrode 22 is formed on the upper portion of the uneven portion 18 only through the insulating film 21, the present invention is not limited thereto and the electrode 22 may be formed on the upper portion of the uneven portion 18 through the insulating film 21 in correspondence with ups and downs of the uneven portion 18 as shown in FIG. 10B.

In this case, as compared with the case of the arrangement shown in FIG. 10A, the thickness D of the inverting layer formed on the surface of the uneven portion 18 when the reverse bias voltage is applied to the electrode 22, that is, the so-called recombination region 19 can be made more uniform.

Consequently, similarly to the case of the solid-state image pickup device according to the above-mentioned embodiment (see FIG. 8), since the electrons serving as the dark current can be recombined with the positive holes on the surface side of the uneven portion 18 and the recombination of the photo-electrically converted signal electric charges can be suppressed on the deep region of the uneven portion 18, a sufficient amount of signal electric charges can be obtained. Accordingly, in addition to the solid-state image pickup devices according to the above-mentioned embodiments, it is possible to further improve the sensitivity characteristic.

While the uneven portion 18 shaped like the triangular prism has been described as the uneven portion 18 formed on the surface of the photo-electric converting portion 3 as shown in FIG. 5, the present invention is not limited thereto and the shape of the uneven portion 18 can be modified as follows.

Figure 11A:
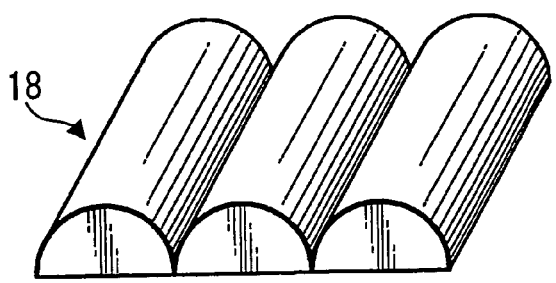
FIGS. 11A to 11D are perspective views showing other shapes of the uneven portion shown in FIG. 7 in an enlarged-scale, respectively.
Figure 11B:
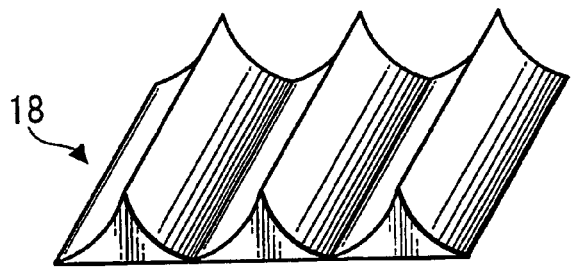
Figure 11C:
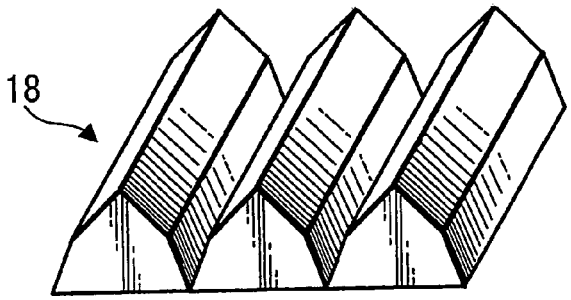
Figure 11D:
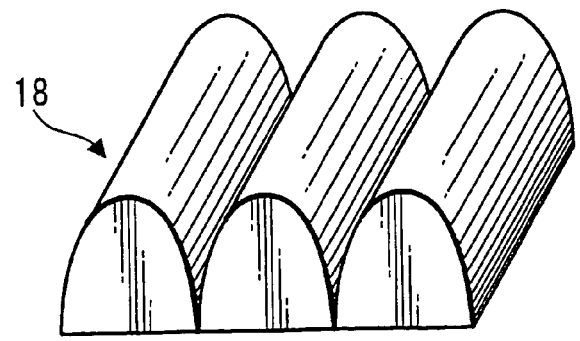

For example, the uneven portion 18 may be shaped like an uneven shape of a semicircular cylinder shown in FIG. 11A, shaped like an uneven portion of an inverted semicircular cylinder shown in FIG. 11B, shaped like an uneven shape of a semi-polygonal cylinder shown in FIG. 11C or shaped like an uneven portion of a cylindrical body of which a cross-section perpendicular to the longitudinal direction increases its width in a quadratic curve fashion (parabolic fashion) in the thickness direction of the semiconductor substrate 1 (in other words, toward the base of the cross-sectional shape).

Also in such a case, as shown in FIG. 5, the pitch between the adjacent ridgelines (or top portions) of individual cylindrical bodies comprising the uneven portion 18 is selected to be less than the longest wavelength of light set as an image pickup target of this solid-state image pickup device and further it is desired that the above pitch should be selected to be less than the shortest wavelength of the light. Further, more preferably, the above pitch can be selected in a range of from ½ to ⅕ of the shortest wavelength of the thus set light.

When the dimension of the pitch is set as described above, the refractive index at which incident light is refracted by the medium within the uneven portion 18 is fluctuated continuously.

Next, a method of manufacturing the solid-state image pickup device according to the above-mentioned embodiment, for example, the solid-state image pickup device having the arrangement including the uneven portion 18 shown in FIG. 8 according to an embodiment of the present invention will be described with reference to FIGS. 12A to 12F.

In FIGS. 12A to 12F, elements and parts identical to those of FIG. 3 are marked with identical reference numerals.

Figure 12A:
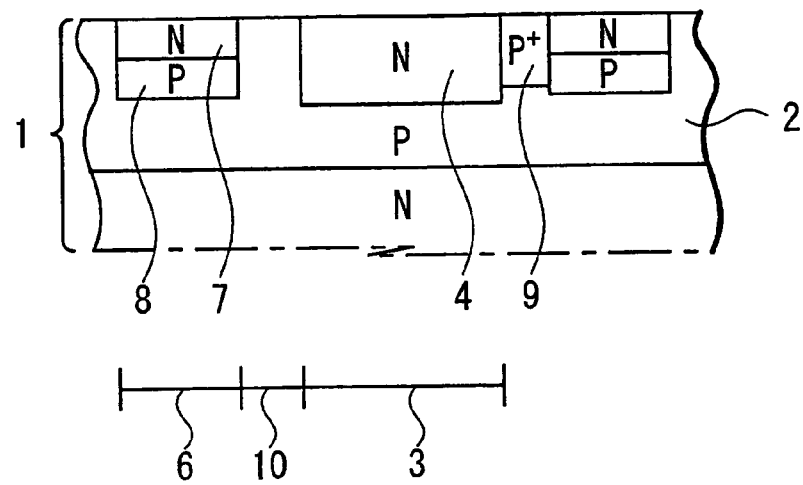
FIGS. 12A to 12F are manufacturing process diagrams showing a solid-state image pickup device manufacturing method according to an embodiment of the present invention, respectively.

Also, as shown in FIG. 12A, let us start to describe this manufacturing method in the state in which the N-type semiconductor region 4 comprising the photo-electric converting portion 3, the N-type transfer channel region 7 and the P type second semiconductor well region 8 comprising the vertical CCD portion and the heavily-doped P-type channel stopper region 9 and the transfer gate region 10 are already formed on the predetermined regions of the N type semiconductor region 1 that is mainly made of the high-purity silicon.

Figure 12B:
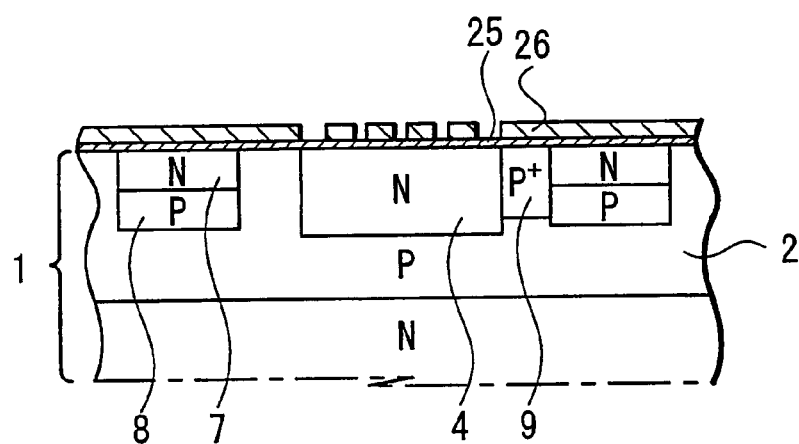
Figure 12C:
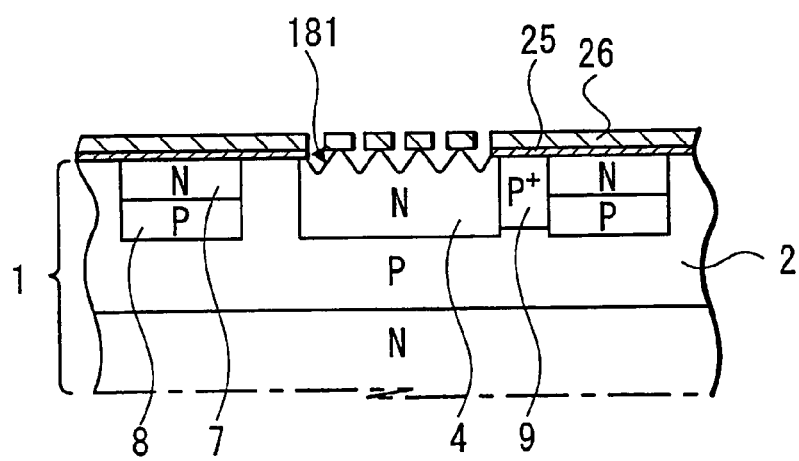
Figure 13:
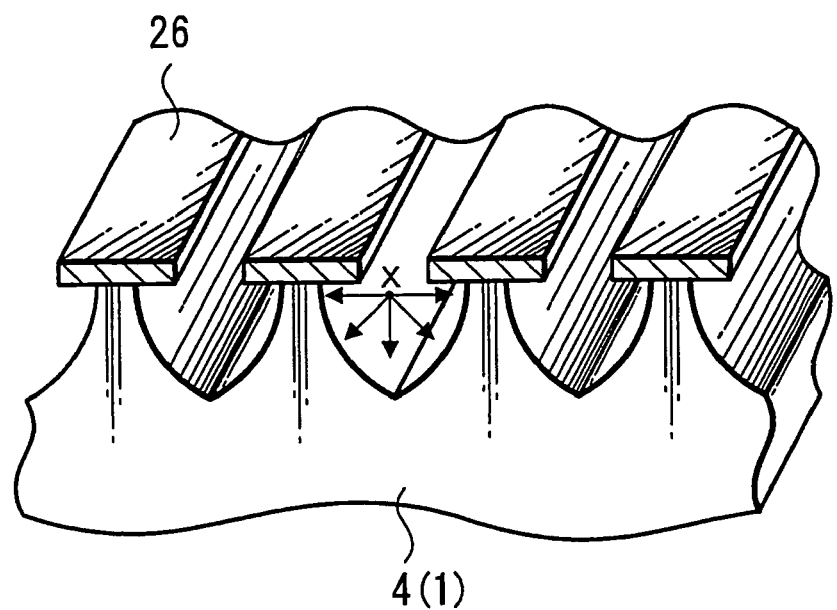
FIG. 13 is a perspective view used to explain an example of a practical method for forming the uneven portion.

First, a surface oxide film 25 is formed on the whole surface of the semiconductor substrate 1 so as to contain the photo-electric converting portion 3, and further a photoresist layer (not shown) is formed on the whole surface of the surface oxide film 25. Then, by the well-known lithography technique, as shown in FIG. 12B, a line and space photoresist 26 is formed from the photoresist layer such that a predetermined inclined surface may be obtained on the surface of the photo-electric converting portion 3 with the application of isotropic etching or side etching in consideration of etching factors in the etching process and the like, Next, as FIG. 13 schematically shows somewhere in the state of the etching process, while adjusting an etch rate in the depth direction (see arrow X in FIG. 13) of the semiconductor substrate 1 and an etch rate of the surface direction (see arrow X in FIG. 13) of the semiconductor substrate 1, that is, the major plane, the semiconductor substrate 1 is treated by anisotropic etching so that it may be side-etched or tapered with a predetermined depth. Thus, as shown in FIG. 12C, concavities and convexities 181 comprising an uneven portion 18 shaped like a triangular prism having a predetermined dimension which will be described later on are arranged on the surface of the photo-electric converting portion 3 with the above-mentioned pitch D.

Figure 12D:
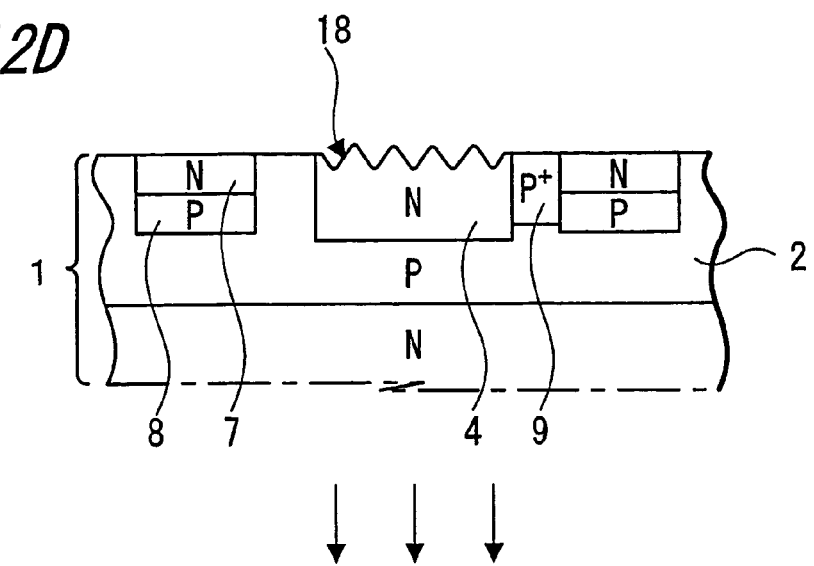

Next, the surface oxide film 25 and the resist mask 26 are removed from the concavities and convexities 181, whereby the uneven portion 18 shaped like the triangular prism is exposed on the surface of the photo-electric converting portion 3 as shown in FIG. 12D.

Figure 12E:
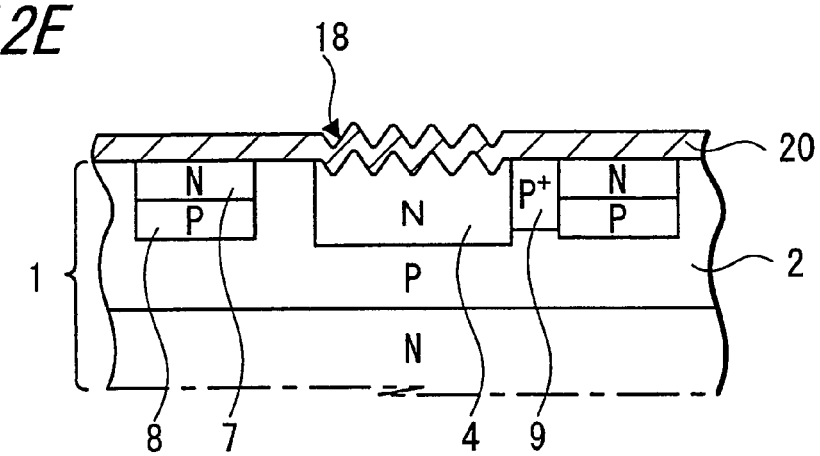

Next, as shown in FIG. 12E, an oxide film 20 is formed on the whole surface of the uneven portion 18 shaped like the triangular prism. This oxide film 20 is formed on the surface of the semiconductor substrate 1 in order to protect the semiconductor substrate 1, for example. Then, ions of P-type impurities (for example, boron B) are implanted on the uneven portion 18 shaped like the triangular prism (that is, the ion implantation technique).

Figure 12F:
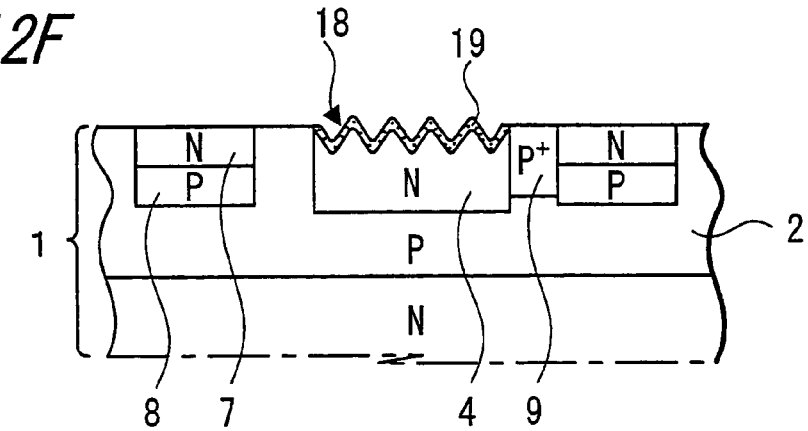

As a result, as shown in FIG. 12F, semiconductor regions 191 made of P-type impurities, that is, recombination regions 19 are formed within the triangular prism-like uneven portion 18 formed on the surface of the photo-electric converting portion 3 in correspondence with the concavities and convexities 181.

After that, the oxide film 20 is removed by an etch-back process, although not shown, the insulating film 11 is formed on the whole surface of the photo-electric converting portion 3, and the transfer electrode 12 formed of the poly-crystalline silicon layer is formed at the corresponding position of the transfer gate portion 10, the N-type transfer channel region 7 and the channel stopper region 9 on the insulating film 11.

Then, the light-shielding layer 14 made of a metal material such as aluminum or tungsten is formed on the transfer electrode 12 through the interlayer insulator 13.

Next, the cover film (passivation film) 14 formed of the transparent silicon oxide film (for example, PSG) is formed on the whole surface of the light-shielding film 14 and the planarized film 16 is formed on the cover film 15. Further, the on-chip microlens 17 is formed on the planarized film 16 at its position corresponding to the photo-electric converting portion 3 through the color filter (not shown).

In this manner, there can be formed the solid-state image pickup device having the arrangement with the uneven portion shown in FIG. 8.

According to the solid-state image pickup device manufacturing method of this embodiment, as shown in FIG. 12D, since the uneven portion 18 shaped like the triangular prism is formed on the surface (interface) of the semiconductor substrate 1 and ions of impurities (P-type impurities) are implanted into the uneven portion 18, the recombination region 19 corresponding to the concavities and convexities can be formed on the surface of the uneven portion 18.

In the process shown in FIG. 12B, for example, when ions of P-type impurities are implanted into the N-type semiconductor region (electric charge accumulating region) 4 and then the uneven portion 18 is formed as shown in FIGS. 12C and 12D, there is formed the uneven portion 18, shown in FIG. 7, in which the recombination region 19 is formed from the surface to the region of the depth direction.

While the method of manufacturing the solid-state image pickup device having the arrangement with the uneven portion 18 shown in FIG. 8 has been described so far in this embodiment, when the solid-state image pickup device including the uneven portion 18 shown in FIG. 10A or 10B, for example, is manufactured, after the process shown in FIG. 12F, the electrode 22 is formed on the whole surface of the semiconductor substrate 1 through the insulating film 21.

Also, when the solid-state image pickup device having the arrangement with the uneven portion 18 shown in FIG. 9 is manufactured, after the process for implanting ions of N-type impurities into the uneven portion 18 through the oxide film 20 shown in FIG. 12E, the oxide film 20 remaining on the surface of the semiconductor substrate 1 is not removed and is thereby left to form the uneven portion 18.

Figure 14:
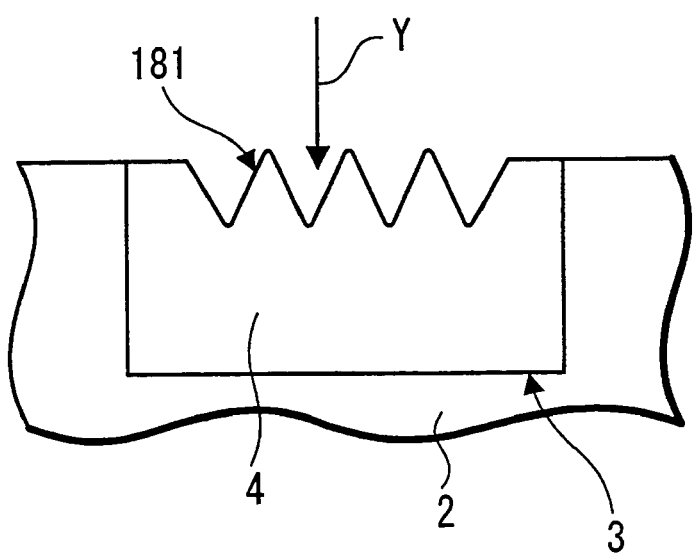
FIG. 14 is a schematic diagram used to explain another example of a practical method for forming the uneven portion.
Figure 15:
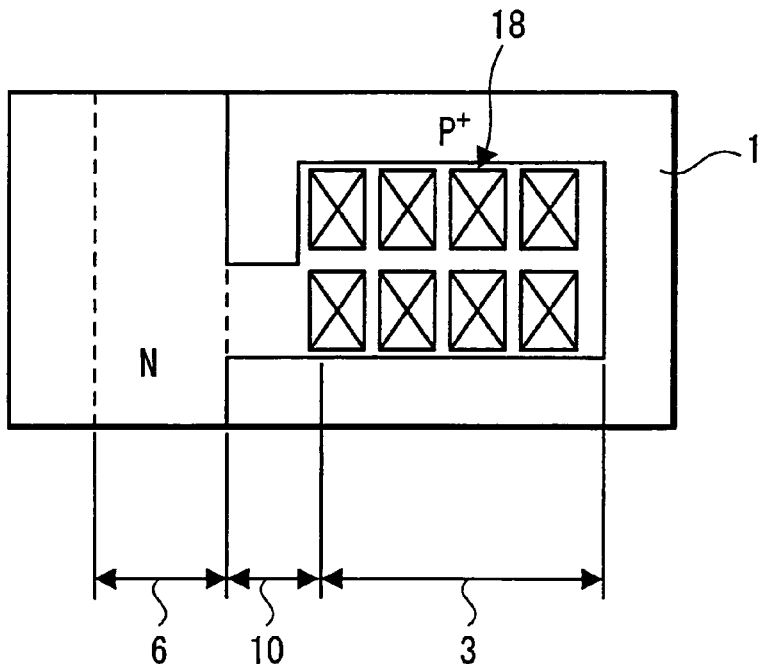
FIG. 15 is a plan view showing another shape of the uneven portion of the solid-state image pickup device shown in FIG. 3.

Also, while the method for forming the uneven portion 18 has been described so far with reference to the case in which the uneven portion 18 is formed on the surface of the photo-electric converting portion 3 by the isotropic etching process or the anisotropic etching process so that the uneven portion 18 may be side-etched with the predetermined aspect ratio, the present invention is not limited thereto, and as shown in FIG. 14, the uneven portion 18 having the similar shape can be formed on the surface of the photo-electric converting portion 3 by irradiating the predetermined position on the surface of the photo-electric converting portion 3 with an energy beam (see arrow Y in FIG. 14) of a predetermined energy density such as laser light.

Also, while the uneven portion 18 is formed on the surface of the photo-electric converting portion 3 by a so-called forward taper-like etching process in which etching is not advanced in the surface direction (width direction) as etching is advanced in the depth direction as set forth in the embodiment of the present invention, the present invention is not limited thereto, and on the contrary, the uneven portion 18 can be formed on the surface of the photo-electric converting portion 3 by a so-called reverse taper-like etching process in which etching is widely (quickly) advanced in the surface direction (width direction) as etching is advanced in the depth direction. In this case, the width of a line in a line and space of the short side of the resist mask 26 should be set to be wider than the space as much as possible.

While the uneven portion (photonic crystal) 18 is formed on the surface of the photo-electric converting portion 3 such that its longitudinal direction is arrayed in alignment with the flat major plane of the semiconductor substrate 1 as described above in the embodiment of the present invention, the present invention is not limited thereto, and the uneven portion 18 may be formed on the surface of the photo-electric converting portion 3 such that its bottom surface may be disposed in parallel to the flat major surface of the semiconductor substrate 1.

Figure 16:
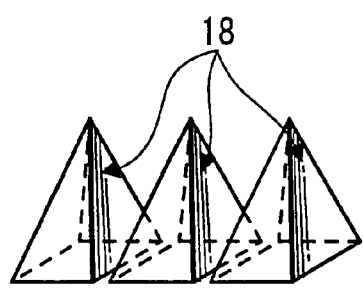
FIG. 16 is a perspective view showing the uneven portion shown in FIG. 15 in an enlarged-scale.

To be concrete, as shown in FIG. 16, the uneven portion 18 is shaped like a quadrangular prism.

Figure 17A:
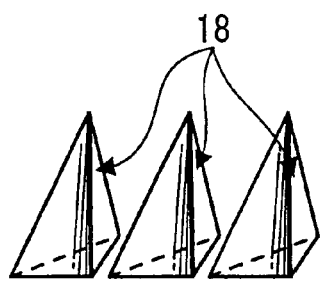
FIGS. 17A and 17B are perspective view showing other shapes of the uneven portion shown in FIG. 15 in an enlarged-scale, respectively.

Besides, the uneven portion 18 can be shaped like a triangular prism shown in FIG. 17A or it can be shaped like a circular cone.

The rest of the arrangement of this solid-state image pickup device is similar to that of the solid-state image pickup device shown in FIG. 3, and identical elements and parts are denoted by identical reference numerals.

In the case of the solid-state image pickup device having the above arrangement, as compared with the case of the solid-state image pickup device having the uneven portion 18 of which the longitudinal direction is laid over the flat major plane of the semiconductor substrate 1 as described above, of the two polarized light components perpendicular to each other to comprise the incident light, not only the reflectance of the polarized light component (S-polarized light component) having a small degree (probability) to produce invalid electric charges which cause the smear can be reduced but also the reflectance of the polarized light component (P-polarized light component) having a large degree to cause the smear can be decreased, which can further increase the whole amount of light introduced into the photo-electric converting portion 3.

Also, of the two polarized light components perpendicular to each other to comprise the incident light, the reflectance of the polarized light component (S-polarized light component) having a small degree to cause the smear is set to be smaller than the reflectance of the polarized light component (P-polarized light component) having a large degree to cause the smear by adjusting the aspect ratio of the bottom surface of the uneven portion 18 shaped like the quadrangular prism shown in FIG. 16, for example, whereby the transmittances of both of the two polarized light components perpendicular to each other can be increased and the whole amount of light that becomes finally incident on the photo-electric converting portion 3 can further be increased.

Relatively, by decreasing the light amount in which the polarized light component (P-polarized light component) having the large degree to cause the smear is introduced into the photo-electric converting portion 3, it is possible to decrease the ratio of light, which causes the smear to occur, relative to the whole amount of light received by the photo-electric converting portion 3. Thus, it is possible to improve the substantial S/N in the output signal (signal electric charge) from the solid-state image pickup device.

Figure 18:
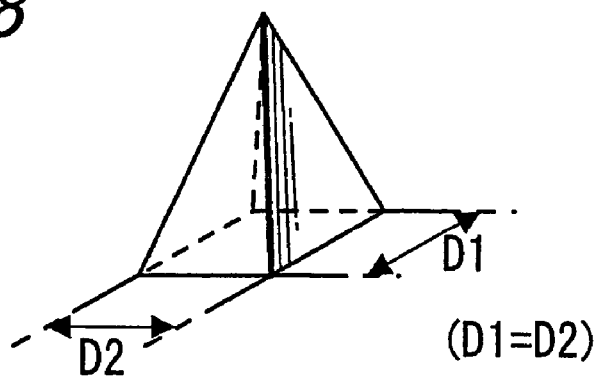
FIG. 18 is a perspective view used to explain the uneven portion shown in FIG. 15 in which case the base of the uneven portion is formed as a square and the width and height thereof are formed at the same pitch.

As shown in FIG. 18, for example, when the ratio between the longitudinal length D1 and the horizontal length D2 of a bottom surface of an uneven portion 18 shaped like a quadrangular prism is set to be 1:1 and the dimensions between two-dimensionally adjoining pitches of the uneven portion 18 are set to be equal in the horizontal and vertical directions, that is, the bottom surface of the quadrangular prism-like uneven portion 18 is formed as a square and the uneven portions 18 are arrayed at the same pitch in the horizontal and vertical directions, both of two polarized light components perpendicular to each other to comprise the incident light are equally decreased in reflectance, and hence transmittances of both a P-polarized light component and an S-polarized light component, for example, can be made the same.

When the aspect ratio of the bottom surface of each of a plurality of quadrangular prism-like uneven portions 18 arranged on the surface of the photo-electric converting portion 3 is set to 1:1, action which can decrease the ratio of light, causing the smear, relative to the whole amount of light received by the photo-electric converting portion 3 does not occur. However, in this case, since the amount in which light received by the photo-electric converting portion 3, is lost by the reflection of light on the surface of the photo-electric converting portion 3 can be minimized, the amount of light incident on the photo-electric converting portion 3 can be maximized.

Accordingly, when a noise caused by the smear, for example, is not so serious in practice and when a problem arises in which the apparent sensitivity of the photo-electric converting portion 3 is low because a sufficiently large amount of light incident on the photo-electric converting portion 3 cannot be obtained, it is extremely effective to set the aspect ratio of the bottom surface of the uneven portion 18 shaped like the quadrangular prism.

A method of manufacturing the solid-state image pickup device having the above-mentioned uneven portion 18 shown in FIG. 17A or 17B will be described with reference to FIGS. 12A to 12F.

First, as shown in FIG. 12A, the N-type semiconductor region 4, the N-type transfer channel region 7 and the P-type semiconductor well region 8 comprising the vertical CCD portion 6 and further the heavily-doped P-type channel stopper region 8 and the transfer gate portion 10 are formed on the predetermined regions of the N-type semiconductor substrate 1 that is mainly made of high-purity silicon.

Figure 19:
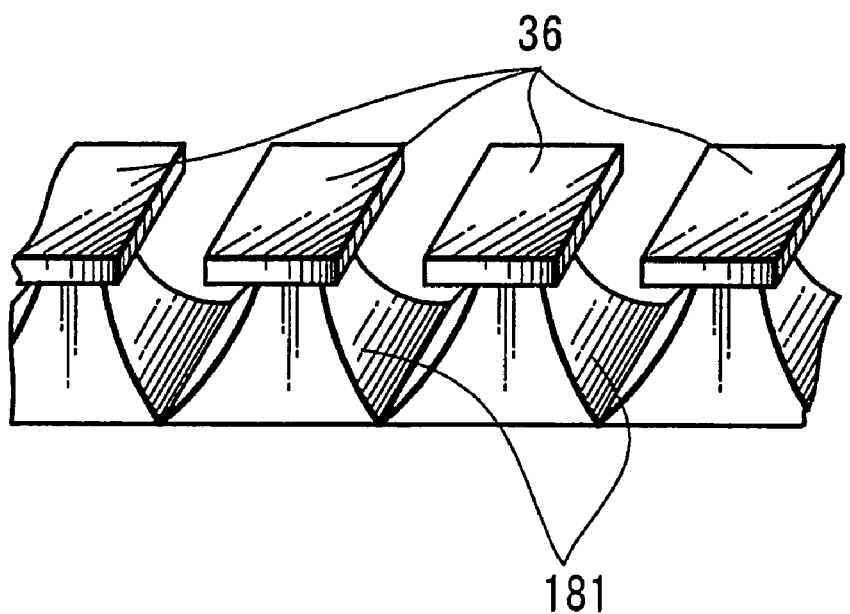
FIG. 19 is a perspective view showing an arrangement of a photoresist that is used to form the uneven portion shown in FIG. 15.

Next, the surface oxide film 25 is formed on the whole surface of the semiconductor substrate 1 so as to contain the photo-electric converting portion 3, and further the photoresist layer (not shown) is formed on the whole surface of the surface oxide film 25. Then, by the well-known lithography technique, a line and space photoresist 26 shown in FIG. 19 is formed from the photoresist layer such that a predetermined inclined surface may be obtained on the surface of the photo-electric converting portion 3 with the application of isotropic etching or side etching in consideration of etching factors in the etching process and the like, Next, as FIG. 13 schematically shows somewhere in the state of the etching process, while adjusting the etch rate in the depth direction of the semiconductor substrate 1 and the etch rate of the surface direction (direction parallel to the major plane) of the semiconductor substrate 1, the major plane, the semiconductor substrate 1 is treated by anisotropic etching so that it may be side-etched or tapered with a predetermined depth. Thus, as shown in FIG. 19, concavities and convexities 181 comprising an uneven portion 18 shaped like a quadrangular prism having a predetermined dimension which will be described later on are arranged on the surface of the photo-electric converting portion 3 with the above-mentioned pitch D.

Next, the surface oxide film 25 and the resist mask 26 are removed from the ridgelines of the uneven portions 181 and thereby the uneven portion 18 shaped like the quadrangular prism is exposed on the surface of the photo-electric converting portion 3, although not shown.

The processes following these processes are similar to those of the solid-state image pickup device manufacturing method according to the above-mentioned embodiment and therefore need not be described.

Figure 17B:
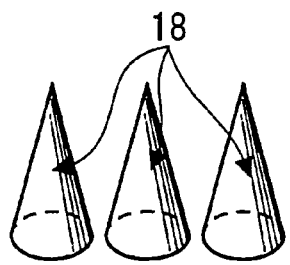

Thus, it is possible to form the solid-state image pickup device having the uneven portion 18 shown in FIG. 17A or 17B.

Figure 20A:
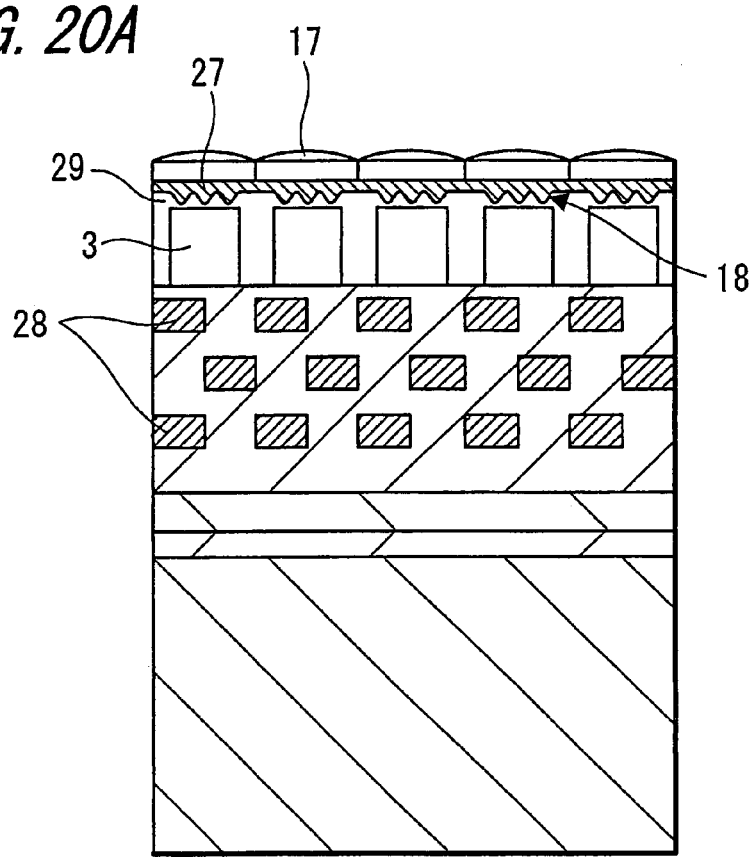
FIGS. 20A and 20B are schematic diagrams showing an arrangement of a rear-illumination type solid-state image pickup device, respectively.

While the present invention is applied to the surface-illumination type solid-state image pickup device in the above-mentioned embodiments, the present invention can also be applied to a rear-illumination type solid-state image pickup device shown in FIG. 20A. In FIG. 20A, elements and parts identical to those of FIG. 3 are denoted by identical reference numerals.

Figure 20B:
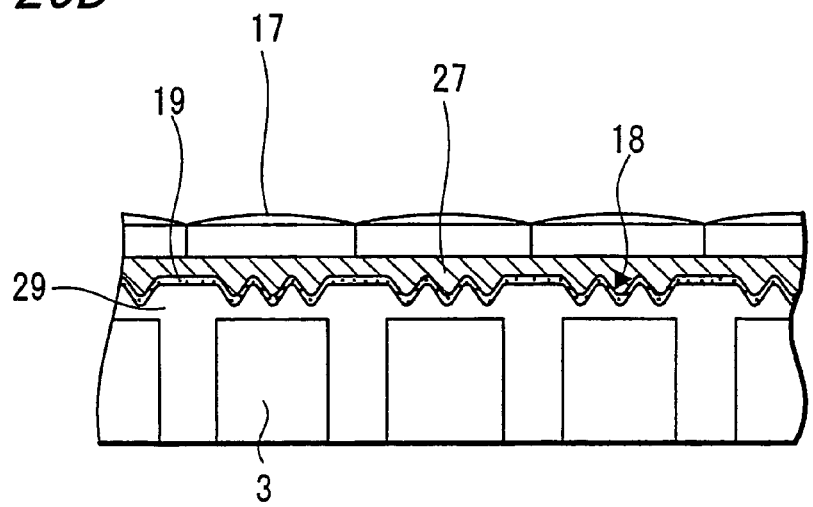

More specifically, the rear-illumination type solid-state image pickup device is a solid-state image pickup device having an arrangement in which interconnection layers 28 and electrodes (not shown) and the like are formed on the surface side so that light may be introduced thereto from the rear side. Then, as FIG. 20B shows a main portion of such rear-illumination type solid-state image pickup device in an enlarged-scale, the above-mentioned triangular prism-like uneven portion 18 is formed at the interface between the element separating region 29 and the planarized film 27 on the photo-electric converting portion 3. Then, the recombination region 19 is formed within the uneven portion 18. The element separating region 29 and the recombination region 19 is made of the same material (for example, P-type semiconductor region).

While the present invention is applied to the solid-state image pickup device in the above-mentioned embodiments, the present invention is not limited thereto and can also be applied to other photo-electric converting apparatuses such as a photo-coupler used singly.

According to the present invention, there is provided a photo-electric converting device having a substrate, a photo-electric converting portion formed on the surface of the substrate and an insulating film formed on the substrate. This photo-electric converting device is comprised of an uneven portion formed at least on one portion of an interface between the substrate of the photo-electric converting portion and the insulating film, the uneven portion having an uneven shape formed along a thickness direction of the substrate and a recombination region for decreasing a dark current formed within the photo-electric converting portion so as to contain at least one portion of the uneven portion.

According to the above-mentioned present invention, since the uneven portion having the uneven shape in the thickness direction of the substrate is formed on at least the interface between the substrate of the photo-electric converting portion and the insulating film and the recombination region for decreasing the dark current is formed within the photo-electric converting portion so as to contain at least one portion of the uneven portion, even when a crystal defect occurs in the surface (interface) of the substrate, for example, electrons serving as the dark current can be distinguished by the recombination region formed within the uneven portion and it is possible to suppress the dark current from being increased due to a decrease of interface states.

According to the present invention, there is provided a photo-electric converting device having a substrate, a photo-electric converting portion formed on the surface of the substrate, an insulating film formed on the substrate, an uneven portion formed at least on one portion of an interface between the substrate of the photo-electric converting portion and the insulating film, with the uneven portion having an uneven shape formed along a thickness direction of the substrate and an electrode formed on the uneven portion. In this photo-electric converting device, a recombination region is formed within the uneven portion by applying a reverse bias voltage to the electrode.

According to the above-mentioned present invention, since the recombination region is formed within the uneven portion by applying the reverse bias voltage to the electrode, the recombination region can be formed within the uneven portion with the application of the reverse bias voltage to the electrode. Thus, even when a crystal defect occurs on the surface (interface) of the substrate, electrons serving as the dark current can be distinguished by the recombination region formed within the uneven portion with application of the reverse bias voltage to the electrode and the dark current can be suppressed from being increased.

According to the present invention, there is provided a method of manufacturing a photo-electric converting device having a substrate, a photo-electric converting portion formed on the surface of the substrate and an insulating film formed on the substrate. This photo-electric converting device manufacturing method comprises the steps of a process for forming a first conductivity type region on the surface of the substrate, a process for forming an uneven portion having an uneven shape in the thickness direction of the substrate on the interface between the first conductivity region and the insulating film and a process for forming a recombination region formed of a second conductivity type region within the uneven portion after the process for forming the uneven portion.

According to the above-mentioned present invention, since the photo-electric converting device manufacturing method comprises the process for forming the first conductivity type region on the surface of the substrate, the process for forming the uneven portion having the uneven shape in the thickness direction of the substrate on the interface between the first conductivity type region and the insulating film and the process for forming the recombination region formed of the second conductivity type region within the uneven portion after the process for forming the uneven portion, it becomes possible to form the recombination region for decreasing the electrons serving as the dark current on the surface of the uneven portion in correspondence with concavities and convexities.

According to the present invention, there is provided a solid-state image pickup device having a substrate, a plurality of photo-electric converting portions formed on the surface of the substrate and an insulating film formed on the substrate. This solid-state image pickup device is composed of an uneven portion formed at least on one portion of an interface between the substrate of the photo-electric converting portion and the insulating film, the uneven portion having an uneven shape formed along a thickness direction of the substrate and a recombination region for decreasing a dark current formed within the photo-electric converting portion so as to contain at least one portion of the uneven portion.

According to the above-mentioned present invention, since the uneven portion having the uneven shape in the thickness direction of the substrate is formed on at least the interface between the substrate of the photo-electric converting portion and the insulating film and the recombination region for decreasing the dark current is formed within the photo-electric converting portion so as to contain at least one portion of the uneven portion, even when a crystal defect occurs in the surface (interface) of the substrate, for example, electrons serving as the dark current can be distinguished by the recombination region formed within the uneven portion and it is possible to suppress the dark current from being increased due to a decrease of interface states.

According to the present invention, there is provided a solid-state image pickup device having a substrate, a plurality of photo-electric converting portions formed on the surface of the substrate, an insulating film formed on the substrate, and an uneven portion formed at least on one portion of an interface between the substrate of the photo-electric converting portion and the insulating film, the uneven portion having an uneven shape formed along a thickness direction of the substrate and an electrode formed on the uneven portion through the insulating film, wherein a recombination region is formed within the uneven portion by applying a reverse bias voltage to the electrode.

According to the above-mentioned present invention, since the recombination region is formed within the uneven portion by applying the reverse bias voltage to the electrode, the recombination region can be formed within the uneven portion with application of the reverse bias voltage to the electrode. Thus, even when a crystal defect occurs on the surface (interface) of the substrate, electrons serving as the dark current can be distinguished by the recombination region formed within the uneven portion with application of the reverse bias voltage to the electrode and the dark current can be suppressed from being increased.

Further, according to the present invention, there is provided a method of manufacturing a photo-electric converting device having a substrate, a plurality of photo-electric converting portions formed on the surface of the substrate and an insulating film formed on the substrate. This photo-electric converting device manufacturing method comprises the steps of a process for forming a first conductivity type region on the surface of the substrate, a process for forming an uneven portion having an uneven shape in the thickness direction of the substrate on the interface between the first conductivity region and the insulating film and a process for forming a recombination region formed of a second conductivity type region within the uneven portion after the process for forming the uneven portion.

According to the above-mentioned present invention, since the photo-electric converting device manufacturing method comprises the process for forming the first conductivity type region on the surface of the substrate, the process for forming the uneven portion having the uneven shape in the thickness direction of the substrate on the interface between the first conductivity type region and the insulating film and the process for forming the recombination region formed of the second conductivity type region within the uneven portion after the process for forming the uneven portion, it becomes possible to form the recombination region for decreasing the electrons serving as the dark current on the surface of the uneven portion in correspondence with concavities and convexities.

Further, according to the photo-electric converting device and the solid-state image pickup device of the present invention, there can be provided the photo-electric converting device and the solid-state image pickup device in which the dark current caused by the interface states can be suppressed even when the uneven portion (photonic crystal) is provided.

Accordingly, it becomes possible to provide the photo-electric converting device and the solid-state image pickup device having a high sensitivity characteristic and in which an S/N can be improved.

Further, according to the photo-electric converting device driving method and the solid-state image pickup device driving method of the present invention, it becomes possible to form the recombination region, which can suppress the dark current from being increased due to the interface states, with the application of a voltage.

Furthermore, according to the photo-electric converting device manufacturing method and the solid-state image pickup device manufacturing method of the present invention, it becomes possible to manufacture the photo-electric converting device and the solid-state image pickup device in which a sensitivity characteristic can be improved and in which a dark current caused by the interface states can be suppressed.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A photo-electric converting device having a substrate, a photo-electric converting portion formed on the surface of said substrate and an insulating film formed on said substrate, comprising:
   an uneven portion formed at least on one portion of an interface between said substrate of said photo-electric converting portion and said insulating film, said uneven portion having an uneven shape formed along a thickness direction of said substrate; and
   a recombination region for decreasing a dark current formed within said photo-electric converting portion so as to contain at least one portion of said uneven portion.

2. A photo-electric converting device according to claim 1, wherein said recombination region is formed of a second conductivity type region formed on a first conductivity type region within said uneven portion.

3. A photo-electric converting device according to claim 2, wherein said second conductivity type region is formed in correspondence with concavities and convexities of said uneven portion.

4. A photo-electric converting device according to claim 1, wherein said uneven portion has an electrode formed thereon through said insulating film.

5. A photo-electric converting device according to claim 4, wherein said electrode is formed along the concavities and convexities of said uneven portion.

6. A photo-electric converting device according to claim 1, wherein said uneven portion is comprised of a plurality of arrays of at least one kind of triangular pyramids or semicircular cylinder or semi-polygonal cylinder arranged such that its longitudinal direction is laid in parallel to a flat major plane of said substrate or is comprised of a plurality of arrays of at least one kind of cylinders whose width of cross-section along the direction perpendicular to the longitudinal direction is changed in the thickness direction of said substrate.

7. A photo-electric converting device according to claim 1, wherein said uneven portion is comprised of a plurality of arrays of at least one kind of a triangular prism or a quadrangular prism or a polygonal prism larger than a pentagonal prism or a circular cone of which bottom surface is arranged in parallel to the flat major plane of said substrate.

8. A photo-electric converting device according to claim 1, wherein each of said adjacent uneven portions is arrayed at a pitch narrower than a longest wavelength of light set as an image pickup target of said photo-electric converting device.

9. A photo-electric converting device according to claim 8, wherein said pitch is set to lie within a range of from ½ to ⅕ of a shortest wavelength of said light.

10. A method of driving a photo-electric converting device having a substrate, a photo-electric converting portion formed on the surface of said substrate and an insulating film formed on said substrate, comprising an uneven portion formed at least on one portion of an interface between said substrate of said photo-electric converting portion and said insulating film, said uneven portion having an electrode formed thereon through said insulating film, an uneven shape formed along a thickness direction of said substrate, and a recombination region for decreasing a dark current formed within said photo-electric converting portion so as to contain at least one portion of said uneven portion, comprising the step of:

forming a recombination region within said uneven portion by applying a reverse bias voltage to said electrode.

11. A method of driving a photo-electric converting device according to claim 10, wherein said reverse voltage is applied to said electrode at least when signal charges are accumulated.

12. A method of manufacturing a photo-electric converting device in which a photo-electric converting portion is formed on the surface of a substrate, an insulating film being formed on said substrate, comprising the steps of:

forming a first conductivity type region on the surface of said substrate;

forming an uneven portion having an uneven shape formed along the thickness direction of said substrate on an interface between said first conductivity type region and said insulating film; and forming a recombination region formed of a second conductivity type region within said uneven portion after the step of forming said uneven portion on said interface.

13. A method of manufacturing a photo-electric converting device according to claim 12, further comprising the step of forming an electrode on said uneven portion through said insulating film after the step of forming said recombination region formed of said second conductivity type region within said uneven portion.

14. A method of manufacturing a photo-electric converting device according to claim 12, wherein said uneven portion is comprised of a plurality of arrays of at least one kind of a triangular prism or a semicircular cylinder or a semi-polygonal cylinder arranged such that its longitudinal direction is laid in parallel to a flat major plane of said substrate or is comprised of a plurality of arrays of at least one kind of cylinders whose width of cross-section along the direction perpendicular to the longitudinal direction is changed in the thickness direction of said substrate.

15. A method of manufacturing a photo-electric converting device according to claim 12, wherein said uneven portion is comprised of a plurality of arrays of at least one kind of a triangular prism or a quadrangular prism or a polygonal prism larger than a pentagonal prism or a circular cone of which bottom surface is arranged in parallel to the flat major plane of said substrate.

16. A solid-state image pickup device having a substrate, a plurality of photo-electric converting portions formed on the surface of said substrate and an insulating film formed on said substrate, comprising:

an uneven portion formed at least on one portion of an interface between said substrate of said photo-electric converting portion and said insulating film, said uneven portion having an uneven shape formed along a thickness direction of said substrate; and a recombination region for decreasing a dark current formed within said photo-electric converting portion so as to contain at least one portion of said uneven portion.

17. A solid-state image pickup device according to claim 16, wherein said recombination region is formed of a second conductivity type region formed on a first conductivity type region within said uneven portion.

18. A solid-state image pickup device according to claim 17, wherein said second conductivity type region is formed in correspondence with concavities and convexities of said uneven portion.

19. A solid-state image pickup device according to claim 16, wherein said uneven portion has an electrode formed thereon through said insulating film.

20. A solid-state image pickup device according to claim 19, wherein said electrode is formed along the concavities and convexities of said uneven portion.

21. A solid-state image pickup device according to claim 16, wherein said uneven portion is comprised of a plurality of arrays of at least one kind of a triangular prism or a semicircular cylinder or a semi-polygonal cylinder arranged such that its longitudinal direction is laid in parallel to a flat major plane of said substrate or is comprised of a plurality of arrays of at least one kind of a cylinder whose width of cross-section along the direction perpendicular to the longitudinal direction is changed in the thickness direction of said substrate.

22. A solid-state image pickup device according to claim 16, wherein said uneven portion is comprised of a plurality of arrays of at least one kind of a triangular prism or a quadrangular prism or a polygonal prism larger than a pentagonal prism or a circular cone of which bottom surface is arranged in parallel to the flat major plane of said substrate.

23. A solid-state image pickup device according to claim 16, wherein each of said adjacent uneven portions is arrayed at a pitch narrower than a longest wavelength of light set as an image pickup target of said photo-electric converting device.

24. A solid-state image pickup device according to claim 23, wherein said pitch is set to lie within a range of from ½ to ⅕ of a shortest wavelength of said light.

25. A solid-state image pickup device according to claim 16, further comprising a buried channel layer of a charge transfer region parallelly spaced apart from said photo-electric converting portion, a CCD vertical register including a transfer electrode disposed above said buried channel layer through an insulating film and a transfer gate for reading electric charges from said photo-electric converting portion and supplying the read signal charges to said CCD vertical register and wherein said uneven portion is formed on an interface of a first conductivity type region of said photo-electric converting portion.

26. A solid-state image pickup device according to claim 16, further comprising said photo-electric converting portion serving as a transfer electrode as well, a plurality of channel stopper regions for separating said photo-electric converting portion and a transfer electrode formed above said photo-electric converting portion and said channel stopper region through an insulating film and wherein said uneven portion is formed on an interface of the first conductivity type region of said photo-electric converting portion.

27. A solid state image pickup device according to claim 25, wherein said uneven portion on the surface of said photo-electric converting portion is a triangular prism or a semicircular cylinder or a semi-polygonal cylinder arranged such that its longitudinal direction is laid in parallel to a flat major plane of said substrate or cylinder whose width of cross-section along the direction perpendicular to the longitudinal direction is changed in the thickness direction of said substrate and the longitudinal direction of said cylinder is disposed substantially in parallel to the longitudinal direction of said transfer electrode or said CCD vertical register.

28. A solid-state image pickup device according to claim 26, wherein said uneven portion on the surface of said photo-electric converting portion is a triangular prism or a quadrangular prism or a polygonal prism larger than a pentagonal prism or a circular cone of which bottom surface is arranged in parallel to the flat major plane of said substrate and the longitudinal direction of said cylinder is disposed substantially in parallel to the transfer direction of said photo-electric converting region.

29. A method of driving a solid-state image pickup device having a substrate, a plurality of photo-electric converting portions formed on the surface of said substrate and an insulating film formed on said substrate in which an uneven portion is formed at least on one portion of an interface between said substrate of said photo-electric converting portion and said insulating film, said uneven portion having an electrode formed thereon through said insulating film and an uneven shape formed along a thickness direction of said substrate, comprising the step of:

forming a recombination region within said uneven portion by applying a reverse voltage to said electrode.

30. A method of driving a solid-state image pickup device according to claim 29, wherein said reverse voltage is applied to said electrode at least when signal charges are accumulated.

31. A method of manufacturing a solid-state image pickup device in which a plurality of photo-electric converting portions are formed on the surface of a substrate, an insulating film being formed on said substrate, comprising the steps of:

forming a first conductivity type region on the surface of said substrate;

forming an uneven portion on an interface between said first conductivity type region and said insulating film, said uneven portion having an uneven portion formed along the thickness direction of said substrate; and forming a recombination region formed of a second conductivity type region within said uneven portion.

32. A method of manufacturing a solid-state image pickup device according to claim 31, further comprising the step of forming an electrode on said uneven portion through said insulating film after the step of forming said recombination region formed of said second conductivity type within said uneven portion.

33. A method of manufacturing a solid-state image pickup device according to claim 31, wherein said uneven portion is comprised of a plurality of arrays of at least one kind of a triangular prism or a semicircular cylinder or a semi-polygonal cylinder arranged such that its longitudinal direction is laid in parallel to a flat major plane of said substrate or is comprised of a plurality of arrays of at least one kind of a cylinder whose width of cross-section along the direction perpendicular to the longitudinal direction is changed in the thickness direction of said substrate.

34. A method of manufacturing a solid-state image pickup device according to claim 31, wherein said uneven portion is comprised of a plurality of arrays of at least one kind of a triangular prism or a quadrangular prism or a polygonal prism larger than a pentagonal prism or a circular cone of which bottom surface is arranged in parallel to the flat major plane of said substrate.

35. A method of manufacturing a solid-state image pickup device according to claim 31, wherein each of said adjacent uneven portions is arrayed at a pitch narrower than a longest wavelength of light set as an image pickup target of said photo-electric converting device.

36. A method of manufacturing a solid-state image pickup device according to claim 35, wherein said pitch is set to lie within a range of from ½ to ⅕ of a shortest wavelength of said light.

* * * * *